United States Patent [19]
Modo et al.

[11] Patent Number: 5,862,365
[45] Date of Patent: Jan. 19, 1999

[54] CONFIGURATION PIN EMULATION CIRCUIT FOR A FIELD PROGRAMMABLE GATE ARRAY

[75] Inventors: Ronald T. Modo, Emmaus; Gary P. Powell, Allentown; Hollis G. Robertson, Northampton; William H. Smith III, Bethlehem, all of Pa.

[73] Assignee: Lucent Technologies Inc., Murray Hill, N.J.

[21] Appl. No.: 710,445

[22] Filed: Sep. 17, 1996

[51] Int. Cl.$^6$ .............................. G06F 9/455; G06F 17/50
[52] U.S. Cl. .......................................................... 395/500
[58] Field of Search ..................... 395/500; 364/480–491, 364/578

[56] References Cited

U.S. PATENT DOCUMENTS 5,276,811  1/1994  Zifferer et al. ........................... 345/275
5,572,710  11/1996  Asano et al. ............................. 395/500
5,581,742  12/1996  Lin et al. ................................. 395/500

OTHER PUBLICATIONS

The Programmable Logic Data Book; Xilinx, Inc.;©1995; pp. 107 (and cover page).

*Primary Examiner*—Kevin J. Teska
*Assistant Examiner*—Agni Mohamed
*Attorney, Agent, or Firm*—Synnestvedt & Lechner

[57] ABSTRACT

An integrated circuit for providing a pin-for-pin replacement of a field programmable gate array (FPGA). The integrated circuit includes an emulation circuit for mimicking the programmable stage (e.g., initialization, configuration and start-up states) of the FPGA. The integrated circuit is designed to be transparent to the user/customer, thereby eliminating the need for a costly redesign of a user's circuit board.

25 Claims, 30 Drawing Sheets

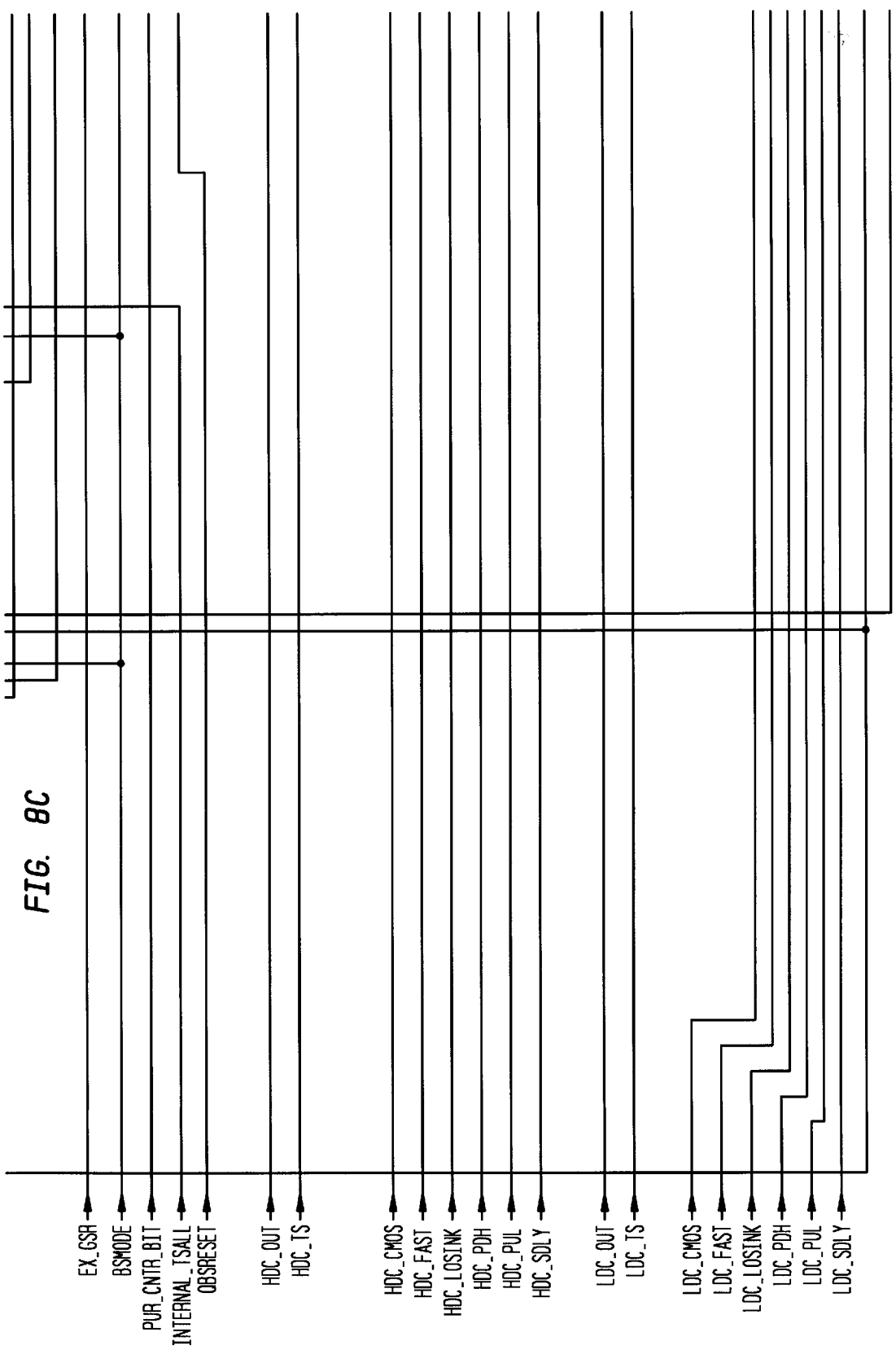

CONFIGURATION PIN EMULATION CIRCUIT FOR A FIELD PROGRAMMABLE GATE ARRAY

FIELD OF THE INVENTION

This invention relates generally to field programmable gate arrays (FPGAS) and, more particularly, to Application Specific Integrated Circuits (ASICs) incorporating circuitry for emulating the configuration signals of a field programmable gate array.

BACKGROUND OF THE INVENTION

Gate arrays (a type of ASIC) and Field Programmable Gate Arrays (FPGAs) are well known in the art. In general, a gate array is an integrated circuit that includes a plurality of predetermined transistor sizes determined by the manufacturer or vendor. Once the transistor size is set, a plurality of transistors are deposited, in layers, on a substrate to form a base or generic array. The manufacturer creates a library of logic cells by combining a plurality of transistors.

When a user identifies a specific need or functionality for a gate array, then the final layer(s) are deposited over the base array, customizing the gate array in accordance with the user's needs. The individual logic cells are connected together in such a way so as to achieve an output desired by the user. After the gate array is manufactured, its internal logic is set and cannot be altered.

Although the cost of the final customized layers are borne by the user, savings are realized since the manufacturing costs associated with producing the base array of transistors is spread over a large number of gate arrays.

Static Random Access Memory (SRAM) based Field Programmable Gate Arrays are integrated circuits that are electrically programmable by the user/customer. The configuration of the FPGA may be changed from time to time to provide different outputs from the same integrated circuit when the user applies external control signals and a data stream to the FPGA.

An FPGA includes a plurality of configurable elements (e.g., AND Gates, NOR Gates, XOR Gates, flip flops, inverters and RAM) which, when connected together, form more complex functions. Furthermore, each configurable element can be connected together to provide even more complex functions. A specific function to be carried out by the configurable element is determined directly by the control signals and the data stream applied to the FPGA and, ultimately, to the configurable elements within the FPGA. In a common operation, the control signals are generated, and the data stream is stored and transmitted by control logic external to the FPGA. An example of the external control logic for generating the control signals is a microprocessor, and for storing the data stream is an erasable programmable read only memory (EPROM) chip.

When a user designs a circuit and/or circuit board in response to a particular need, a prototype is developed that may include FPGAs in order to facilitate testing and troubleshooting of the circuit. The data stream, stored on an EPROM, can be easily changed by the user. When the FPGA receives the new data stream, the logic elements within each configurable element and the connections between the configurable elements are changed (i.e., they are configured in accordance with the new data stream). Therefore, the output signals from the FPGA, which are generated in response to specific input signals, are changed. Since the output signals of the FPGA change, there is a corresponding effect on the overall user's circuit board.

After the user has finalized the design of the circuit on the circuit board, the layout of the circuit board can be redesigned and the FPGAs replaced by less expensive gate arrays. Since gate arrays do not have configurable logic elements they do not need external control signals; therefore, certain external logic circuits (e.g., EPROMs) can be eliminated, and extensive redesign of the circuit and circuit board may be required. Even though costs are incurred in redesigning the circuit board, for high volume productions of circuit boards, it is cost-effective to replace the FPGAs with gate arrays.

Xilinx, Inc. has developed a capability entitled HardWire to provide a pin-for-pin replacement for the Xilinx family of FPGAs. HardWire devices are identical to their corresponding FPGAs, however the programmable or configurable elements in the FPGA are removed and replaced with fixed metal connections (i.e., they are "hard-wired" together). The HardWire configuration circuitry is mapped directly from the Xilinx FPGA configuration circuitry. Since a HardWire device is architecturally identical to its corresponding FPGA, it has the same number of gates as the corresponding FPGA. Therefore, a reduction in manufacturing costs may be realized, but there is usually no increase in the area efficiency.

SUMMARY OF THE INVENTION

The subject invention is an apparatus and method for providing a pin-to-pin emulation of SRAM-based FPGAs that is transparent to the user. The present invention may be implemented in any application specific integrated circuit (ASIC), e.g., a full custom chip, a standard cell, or a gate array.

The field programmable gate array (FPGA), has two functional stages, namely a programmable or configurable stage which commences at power on, and an operational stage which commences after the FPGA has been configured. The programmable stage may be further split into four states, namely initialization, configuration, start-up and reconfiguration. The present invention comprises an emulator circuit for mimicking the initialization, configuration, start-up and reconfiguration states of the FPGA. As a result, the emulator circuit of the present invention provides the user with a transparent migration from the FPGA to an ASIC.

BRIEF DESCRIPTION OF THE DRAWINGS

FIGS. 8(a)–8(d) are schematic block diagrams of the primary pin emulation circuit of FIG. 7.

DETAILED DESCRIPTION OF THE PREFERRED EMBODIMENT

Figure 1:
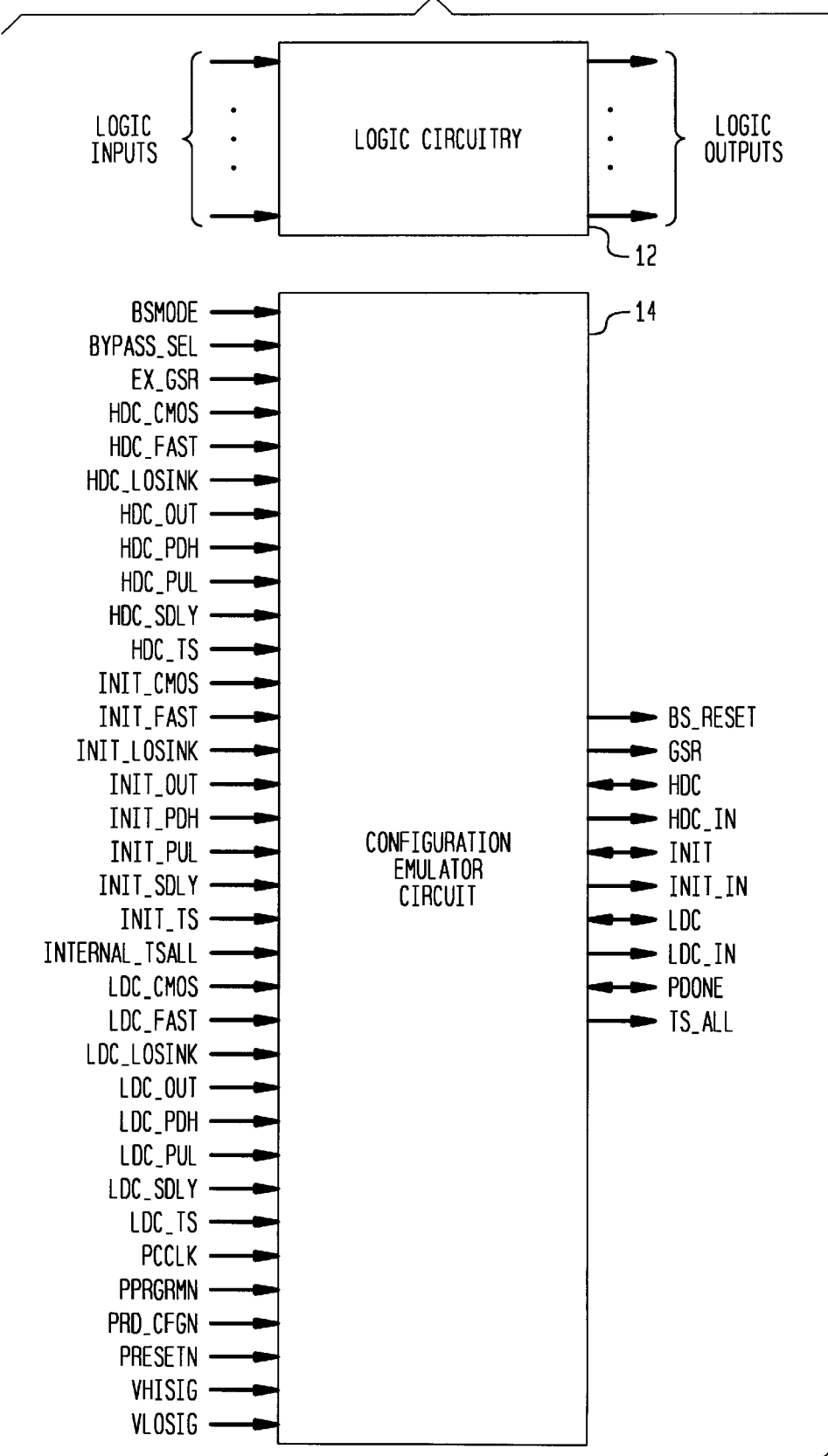
FIG. 1 is a block diagram of an ASIC for emulating an FPGA in accordance with the present invention showing its external pin connections.

The present invention is a circuit for emulating or mimicking the signals generated by a Field Programmable Gate Array's (FPGA) configuration pins. (Specifically, the pins used to control the download of the data stream during the programmable stage.) For the purpose of illustration, the subject invention will be described with respect to Lucent Technology, Inc.'s (formerly AT&T) family of field programmable gate arrays (FPGAs), commonly known as Optimized Reconfigurable Cell Array (ORCA). (ORCA is a trademark of Lucent Technologies, Inc.) Accordingly, the AT&T Field-Programmable Gate Arrays Data Book dated April 1995 is hereby incorporated by reference.

The principal embodiment described hereinafter is meant to be illustrative only and not limiting. One skilled in the art could readily adapt the principles and teachings described herein to provide a pin-for-pin emulation of any FPGA (i.e., an FPGA can be removed from its socket and an ASIC incorporating a circuit according to the present invention can be inserted directly into the FPGA socket).

Interfaces and libraries for many computer aided engineering tools for the design and eventual manufacture of the FPGA are known in the art. In the preferred embodiment, the ORCA Foundry Development System is used to process a design from a netlist to a configured FPGA. Following design entry, the development system's map, place and route tools translate the netlist into a data stream which is programmed into the FPGA.

An FPGA has two primary working stages, a programmable stage and an operational stage. The programmable stage consists of a plurality of distinct sequential states, namely, initialization, configuration, and start-up. When power is supplied to an FPGA, the internal voltage of the FPGA ramps up and the FPGA enters its initialization state. Ramping up of the internal voltage of the FPGA triggers an internal power-up-reset circuit. When the power-up-reset circuit turns on, the RAM, the configurable elements and a configuration clock counter of the FPGA are cleared. During initialization a boundary scan reset output goes high (i.e., BS_RESET is released), an INIT output goes low, a DONE output goes low and an internal output signal (e.g., TS_ALL) used to place input/output (I/O) buffers into their tri-state mode goes high. The DONE output is used to signal to external logic that the FPGA has completed the programming of its configurable elements. The INIT output is used to signal to external logic that the FPGA has completed initialization. (Note manufacturer's may call their FPGA's outputs different names but all have outputs to indicate when initialization is over, configuration is over and when boundary scan can be used. The FPGA will also have an internal output to tri-state all I/O buffers.)

At the end of initialization, the initialization output, INIT, is pulled high to signal that the FPGA has completed its initialization state and is entering its configuration state. During configuration, the FPGA programs its configurable elements and various output pins of the FPGA are set to specific values; in particular, the high during configuration (HDC) goes high, the low during configuration (LDC) goes low, DONE stays low, and the internal TS_ALL signal stays high. When the FPGA enters its configuration state, the configuration clock counter in the FPGA, which was previously set to zero, begins to count configuration clock cycles that are generated by external logic and applied to the FPGA.

The FPGA's functionality is determined by a bit stream and control signals applied to its configuration pins. The bit stream is programmed in from external logic circuits (e.g., an EPROM).

During configuration the FPGA has several inputs for receiving control signals (e.g., RESET and PRGM) which are generated by external logic circuits (e.g., a microprocessor). When the FPGA is in its configuration state, an assertion of either the RESET or the PRGM input aborts the configuration state and returns the FPGA to the initialization state. During the start-up state and operating stage, the assertion of the PRGM input causes a reconfiguration.

After configuration, the DONE output signal goes high and the FPGA enters the start-up state which is a transition between the configuration and operational states. The start-up state begins when the number of configuration clock cycles received after INIT goes high is equal to the value of the length count field in the configuration frame and when the end of configuration frame has been written. At this point the FPGA determines that it is done reading in the bit stream, and that it is configured. The primary design issue during start-up is to ensure the user I/O buffers become active without inadvertently activating devices in the system or causing bus contention.

After the start-up state, the FPGA enters its operational stage. The configurable elements and I/Os are in their configured state and the FPGA appears to other system circuits as external logic.

The configuration emulator circuit of the subject invention utilizes a library of standard logic functions taken from the ASIC manufacturer for mimicking the programmable and operational stages of the FPGA. Since the operational stage can be implemented using relatively straight-forward logic, the subject invention deals primarily with a pin emulation circuit that emulates the inputs and outputs of the FPGA during the programmable stage.

Referring now to FIG. 1, an ASIC for emulating a Static Random Access Memory (SRAM)-based FPGA family is generally indicated as 10. The ASIC 10 is designed to be a pin-for-pin replacement of an FPGA (i.e., the FPGA can be removed from the circuit board and replaced with the ASIC). Although any ASIC may be used, the preferred embodiment implements the emulation using a gate array.

The subject emulation circuit comprises a first counter means for counting to a first predetermined count (which corresponds to a predetermined period of time) to simulate the period of time an FPGA needs to change specific command outputs, a second counter means for counting to a second predetermined 15 count to simulate the period of time the FPGA requires to complete its programmable stage, and signal emulation means for providing a configuration-mimicking state during the period of time said second counter means is counting. The pin emulation means accepts input signals from circuits external to the configuration emulator circuit and generates appropriate output signals in response to said input signals.

The ASIC 10 comprises logic circuitry 12 for carrying out the logic functions of a configured FPGA, and an FPGA configuration emulator circuit 14 for emulating or mimicking the initialization/configuration circuitry of the FPGA. The configuration emulation circuit 14 is an important aspect of certain embodiments of the present invention.

The logic circuitry 12 preferably includes logic gates and user input/output (I/O) buffers. (User I/O buffers are any buffers in which the user can use to facilitate the transfer of data into and out of the ASIC.) The logic circuitry 12 is designed to provide the same output signals that a configured and operational FPGA would generate in response to specific input signals. Accordingly, the circuitry external to the replaced FPGA "sees" the same signals as if the FPGA is still present.

The logic circuitry 12 is preferably designed by retargeting the output of the ORCA Foundry Development System. The design of the logic circuitry 12 is set (i.e., it cannot be reconfigured). Therefore, the circuitry and interconnecting wires associated with reading the data stream and making an FPGA programmable can be eliminated in the present invention. This reduces the silicon size of the ASIC relative to the silicon size of the FPGA that is being emulated.

Since the ASIC 10 is designed to be a pin-for-pin replacement for the FPGA, it must be transparent to the user. Accordingly, the ASIC must not only generate output signals in response to specific input signals when simulating the FPGA in its operational stage, it must also generate the appropriate signals during the programmable stage (during the initialization, configuration and start-up states)—even though the ASIC does not have any programmable elements. Accordingly, the configuration emulator circuit 14 of the present invention preferably contains logic circuits for mimicking the input and output signals of an FPGA during initialization, configuration and start-up.

Figure 2:
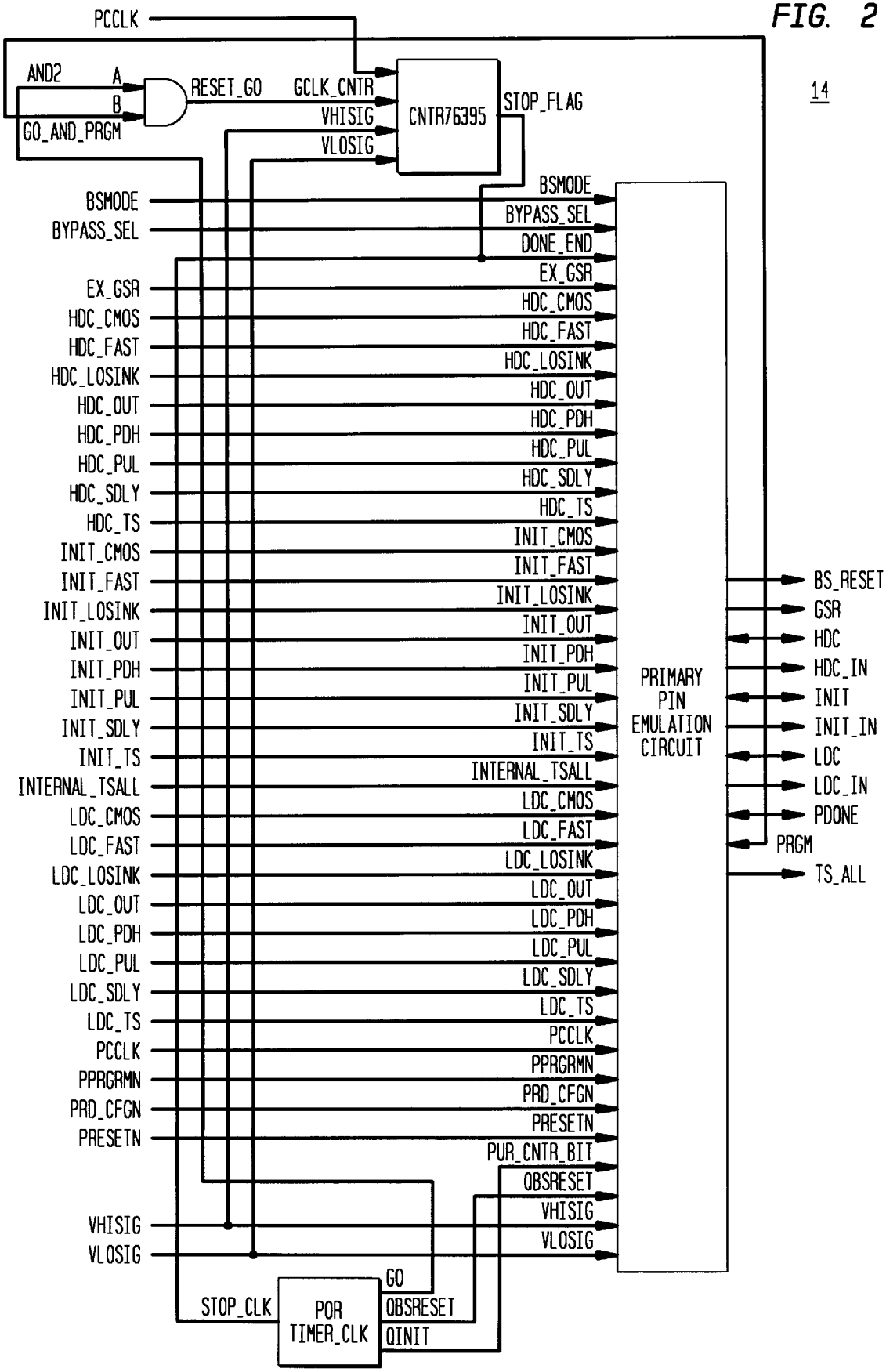
FIG. 2 is a block diagram of the configuration emulator circuit of FIG. 1 showing the connections between the three primary circuits that comprise the configuration emulator circuit.
Figure 3:
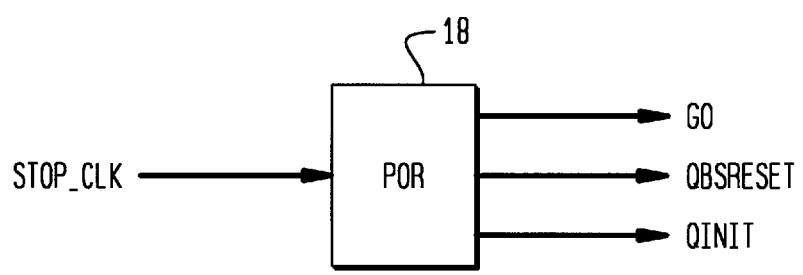
FIG. 3 is a block diagram of the power-on-reset circuit of the configuration emulator circuit of FIG. 2 showing its external pin connections.
Figure 5:
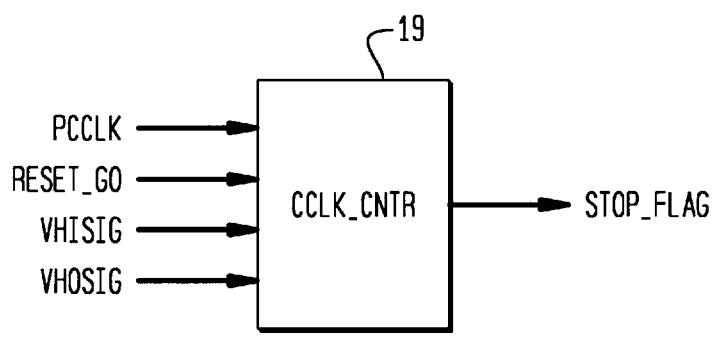
FIG. 5 is a block diagram of the configuration clock counter circuit of FIG. 2 showing its external pin connections.

Referring now to FIG. 2, a preferred configuration emulator circuit 14 generally consists of a primary pin emulation circuit 16, an AND gate 17 and two counting means. A first counting means 18 can be almost any timing/delay circuit that deactivates the Boundary Scan Reset and signals to the primary pin emulation circuit 16 to bring its INIT pin high. In the preferred embodiment, the first counting means 18 is a power-on-reset circuit having outputs GO, QBSRESET, and QINIT and input STOP_CLK as shown in FIG. 3, and the second counting means 19 is a configuration clock counter circuit having inputs PCCLK, RESET_GO, VHISIG and VLOSIG, and output STOP_FLAG as shown in FIG. 5.

Figure 4A:
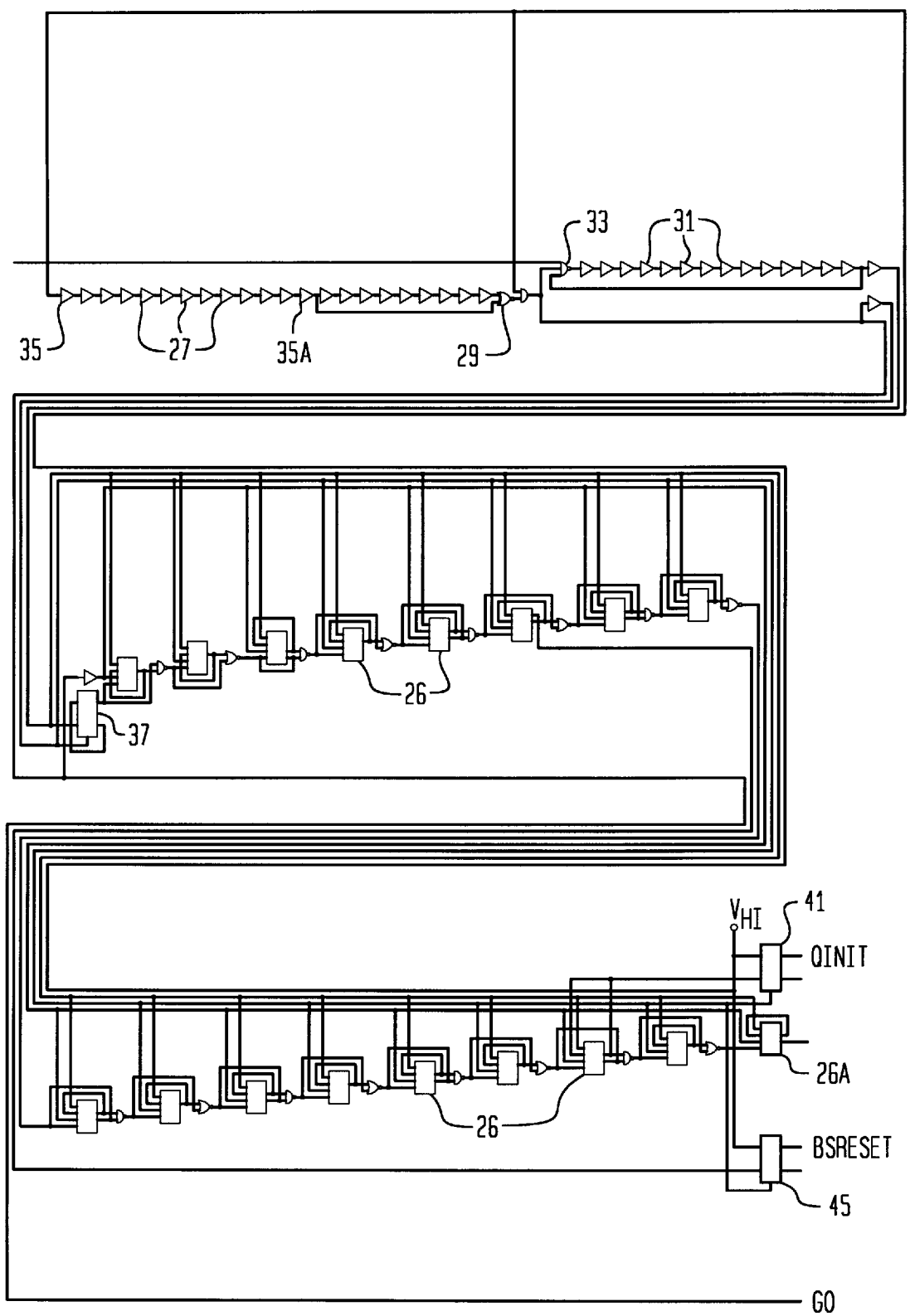
FIG. 4A is a schematic block diagram of the power-on-reset circuit of FIG. 3.
Figure 4B:
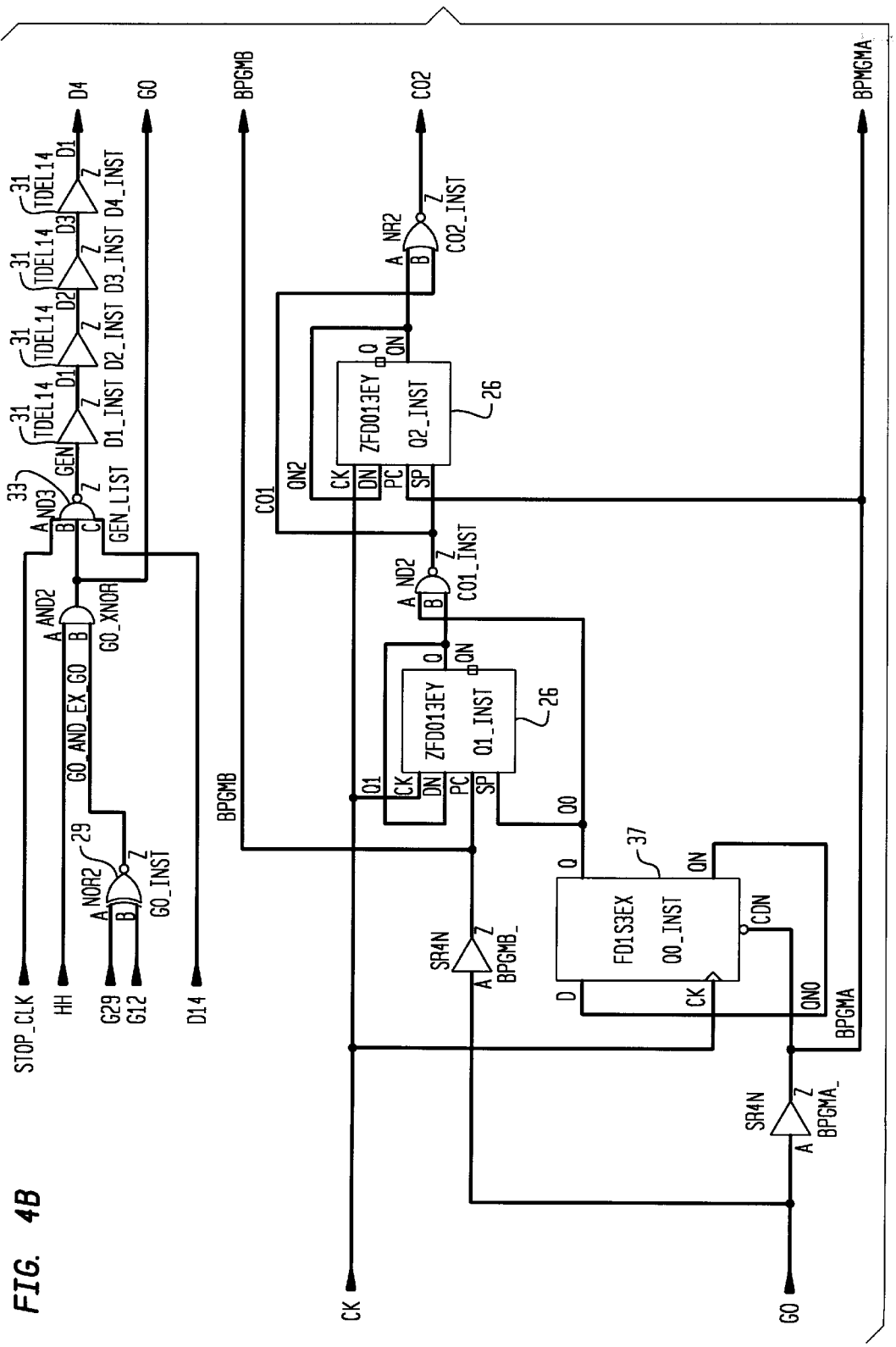
FIGS. 4B–4G are enlarged schematic block diagrams of the power-on-reset circuit of FIG. 4A.
Figure 4C:
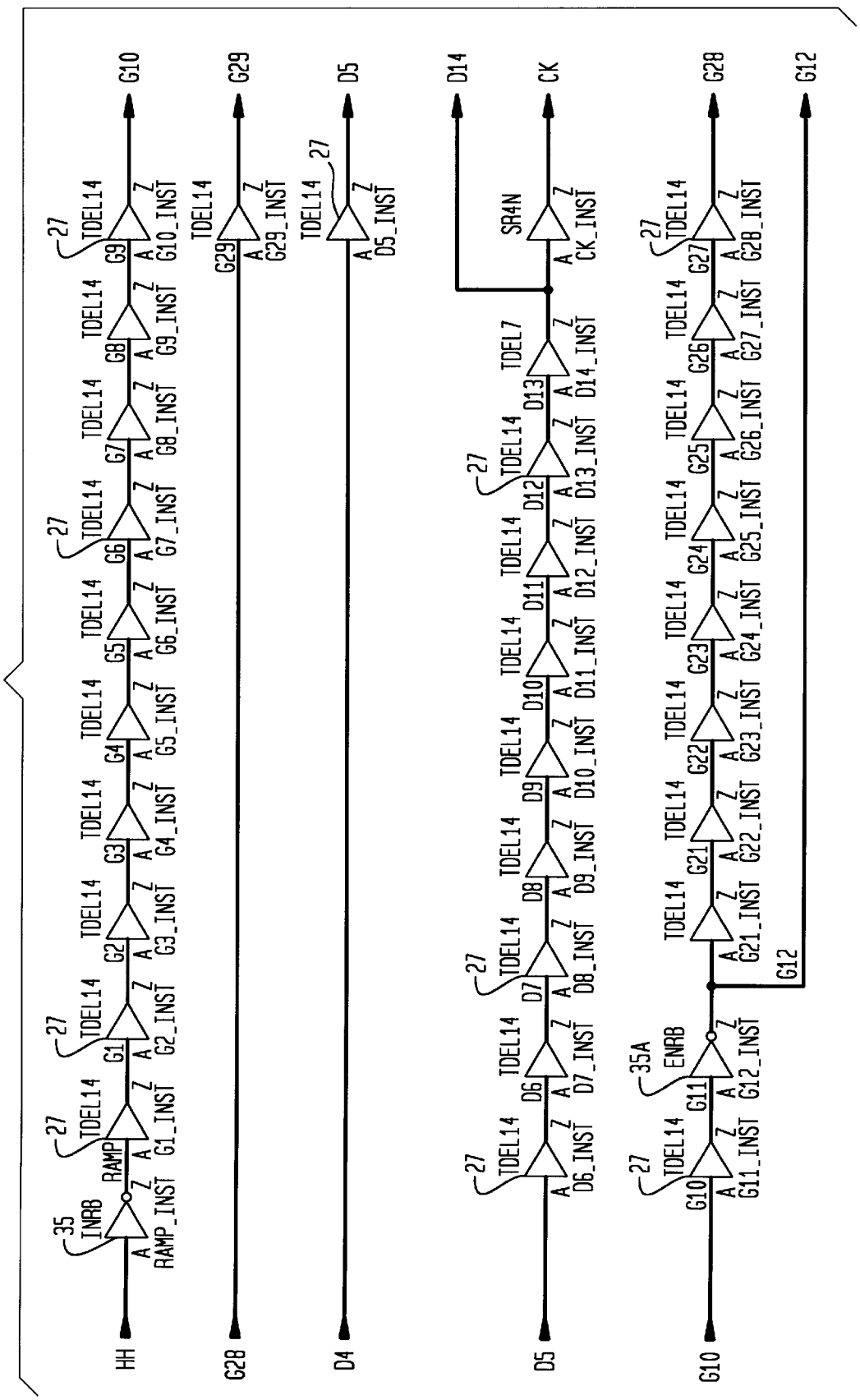
Figure 4D:
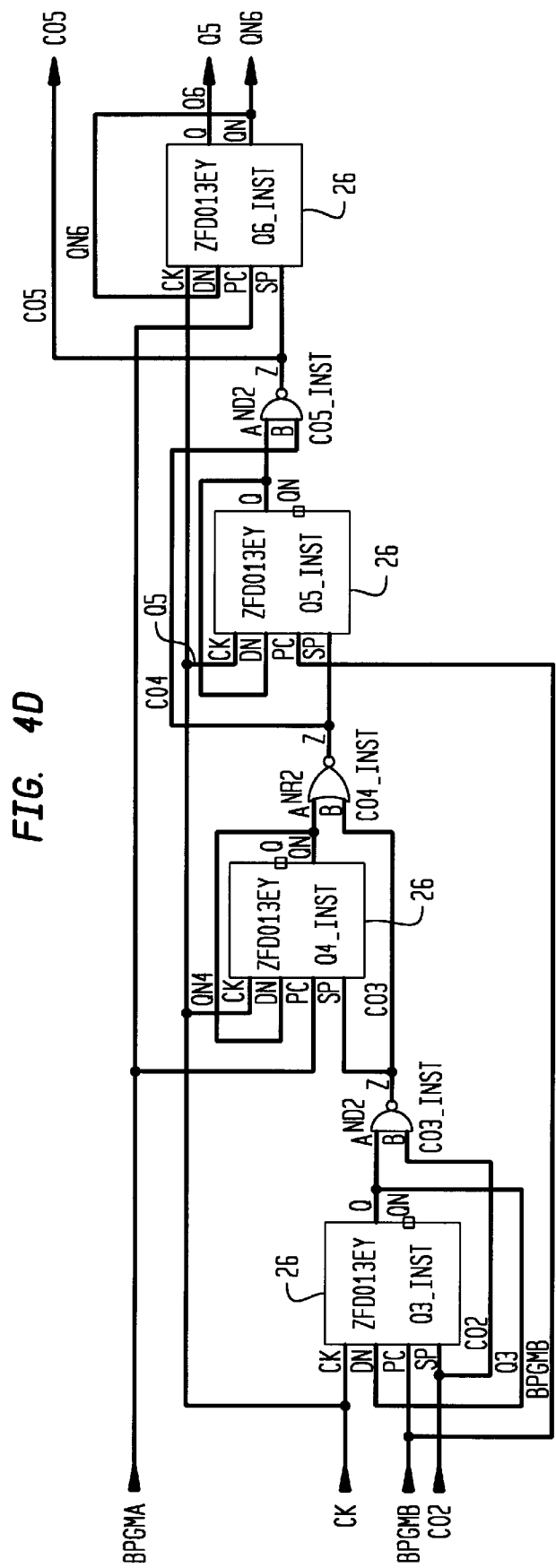
Figure 4E:
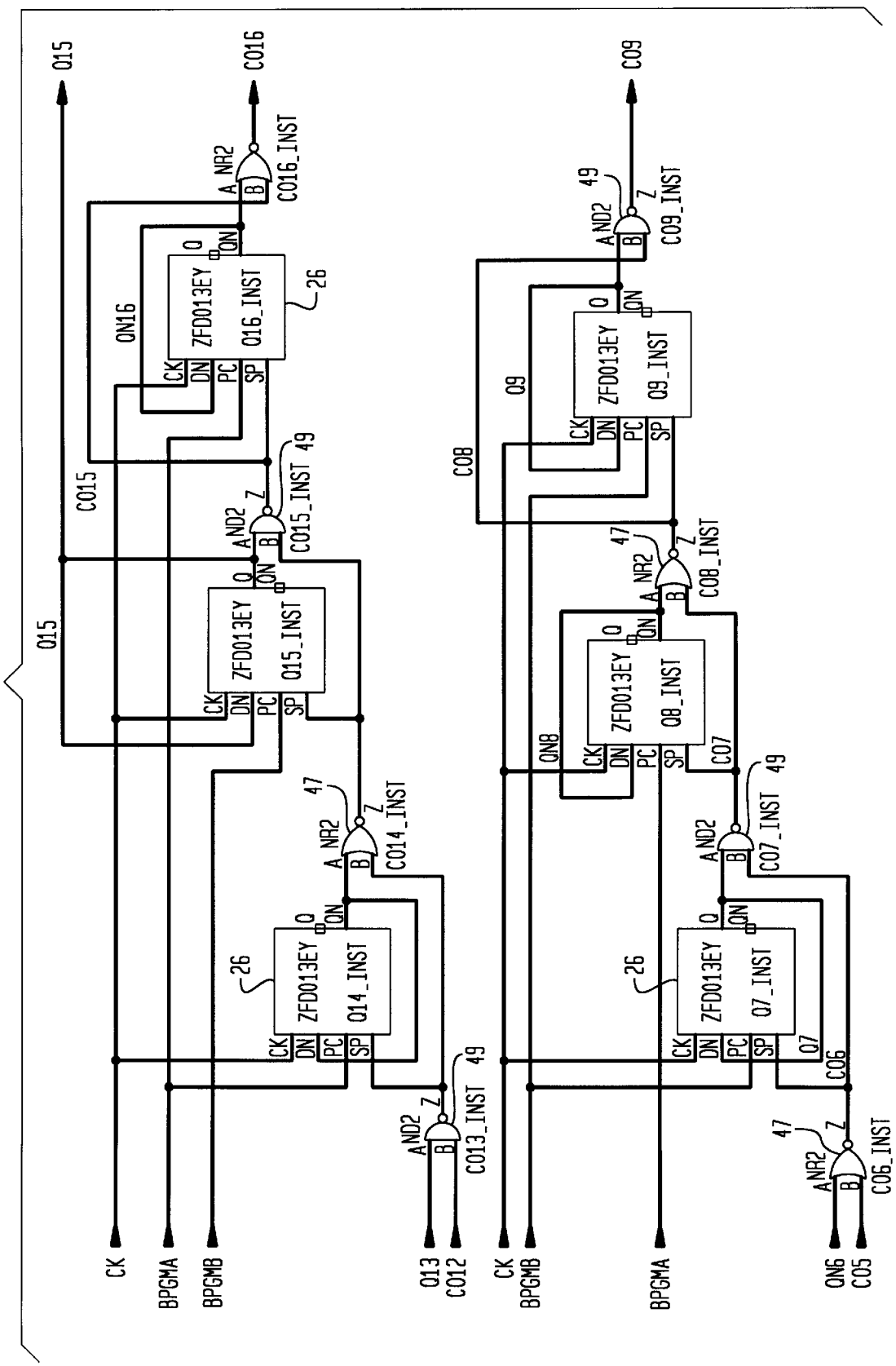
Figure 4F:
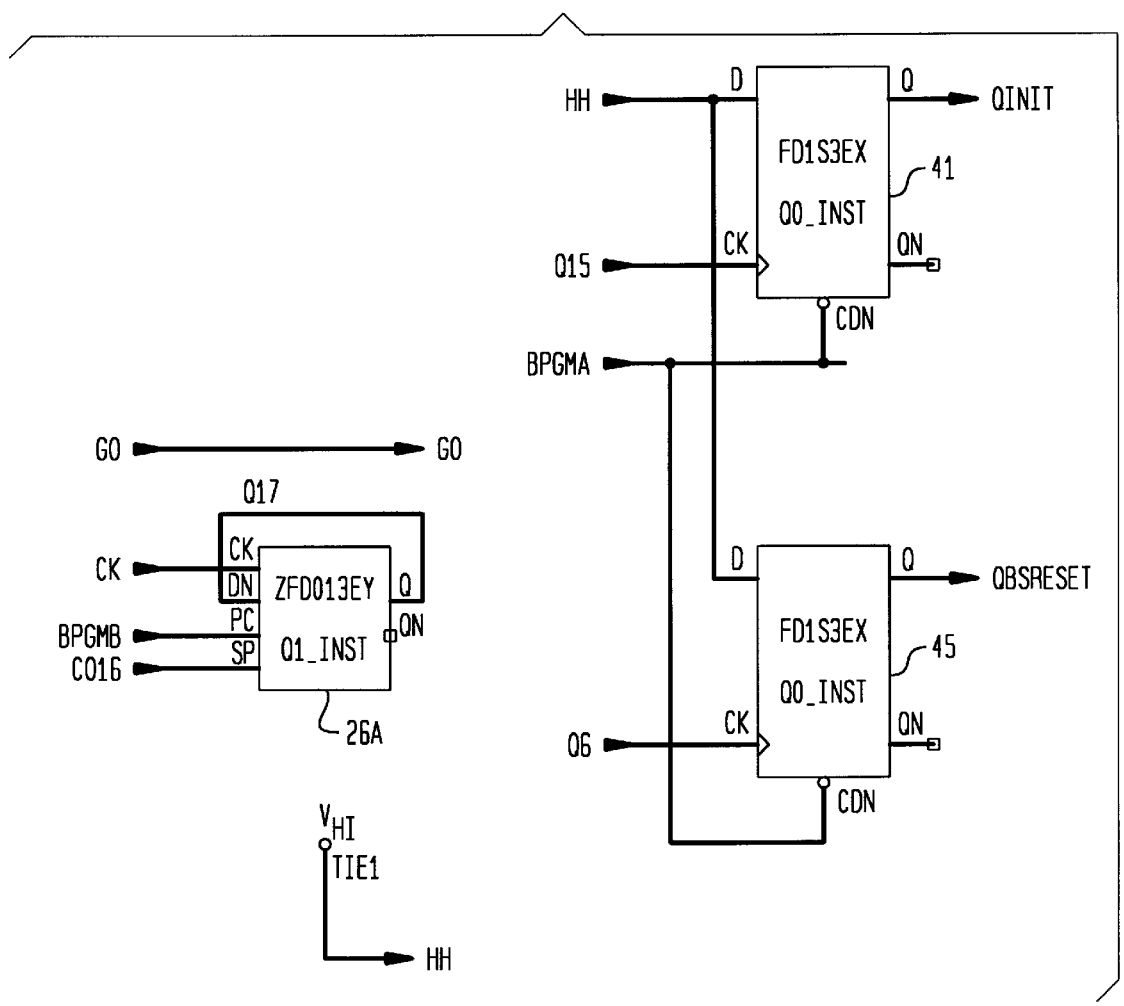
Figure 4G:
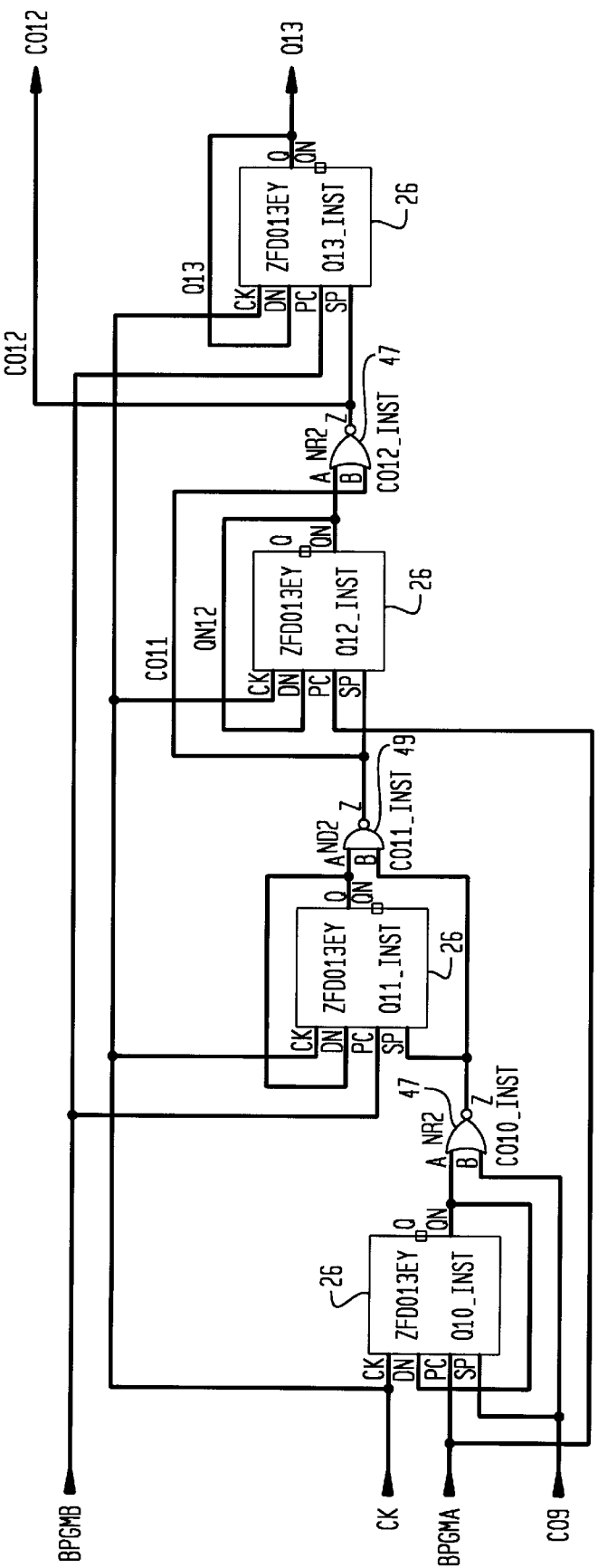
Figure 21:
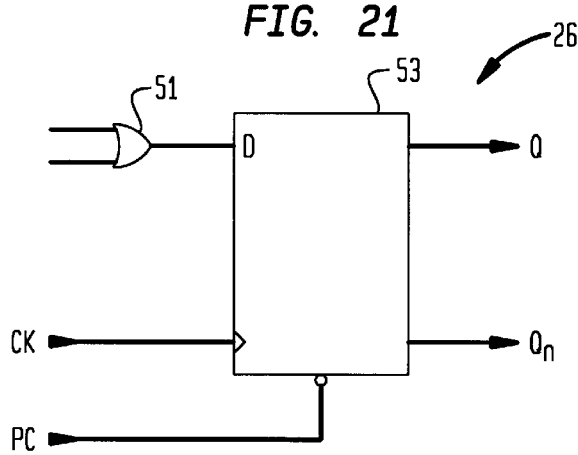
FIG. 21 is a schematic block diagram of a counting element.
Figure 22:
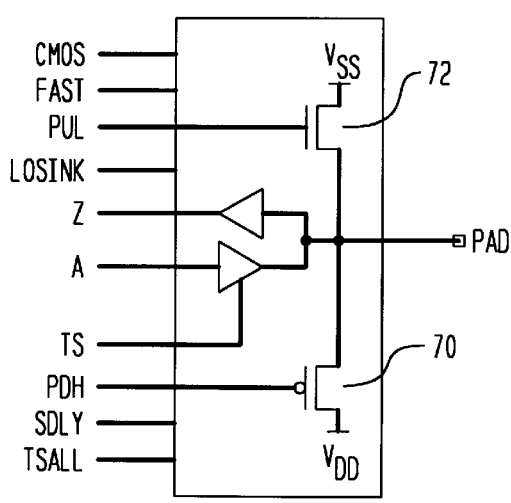
FIG. 22 is a symbol schmematic of a user I/O buffer which is used in the primary pin emulation circuit of FIG. 8.

Referring now to FIG. 4A, a schematic diagram of the power-on-reset circuit 18 is shown; it includes a pulse generator circuit 22, a ring oscillator 23 and a counter 25. FIGS. 4B–4G an enlarged schematic diagrams of FIG. 4A. The pulse generator circuit 22 includes a plurality of delay elements 27, inverters 35, 35A and an exclusive nor (XNOR) gate 29. The ring oscillator circuit 23 includes a plurality of delay elements 31 and NAND gate 33. The counter 25 includes a plurality of counting elements 26, a plurality of NOR gates 47, a plurality of NAND gates 49 and flip flops 37, 41, 45. As shown in FIG. 21, the counting element 26 consists of an XOR gate 51 and a flip-flop 53.

The specific number of delay elements 27, 31 depends on the frequency of the ring oscillator (the higher the frequency the lower the number of delay elements are needed and vice versa). The number of counting elements 26 depends on the length count field in the configuration frame of the FPGA data stream (i.e., the longer the length count field, the greater the number of elements are needed).

The power-on-reset circuit 18 generally runs during the period of time corresponding to the time the FPGA is in its initialization and configuration states. When the ASIC 10 containing the configuration emulation circuit 14 is turned on, power begins to flow to the pulse generator 22. As the voltage ramps up, the pulse generator 22 generates a pulse that resets the counter 25 and initiates counting up to a predetermined count. The predetermined count is generally selected to approximate the time it takes for an FPGA to go from power-up to the completion of its initialization state (i.e., the time it takes to clear the configurable elements and RAM of the FPGA and to set the initialization output high). The power-on-reset circuit 18 is generally inactive after it has counted up to the predetermined count and only becomes active again when the ASIC 10 is turned off and back on.

Referring again to FIG. 2, the GO output of the power-on-reset circuit 18 is connected to a first input of AND gate 17; a second input of AND gate 17 is connected to the PRGM output of the primary pin emulation circuit 16; and the output of AND gate 17 is connected to the RESET_GO input of configuration clock L counter circuit 19. GO is generated at power up. When the GO output is triggered, it resets the configuration clock counter circuit 19. The remaining two outputs of the power-on-reset circuit 18, namely, QBSRESET and QINIT, are connected to corresponding inputs of the primary pin emulation circuit 16. (See FIGS. 2 and 7).

Figure 6A:
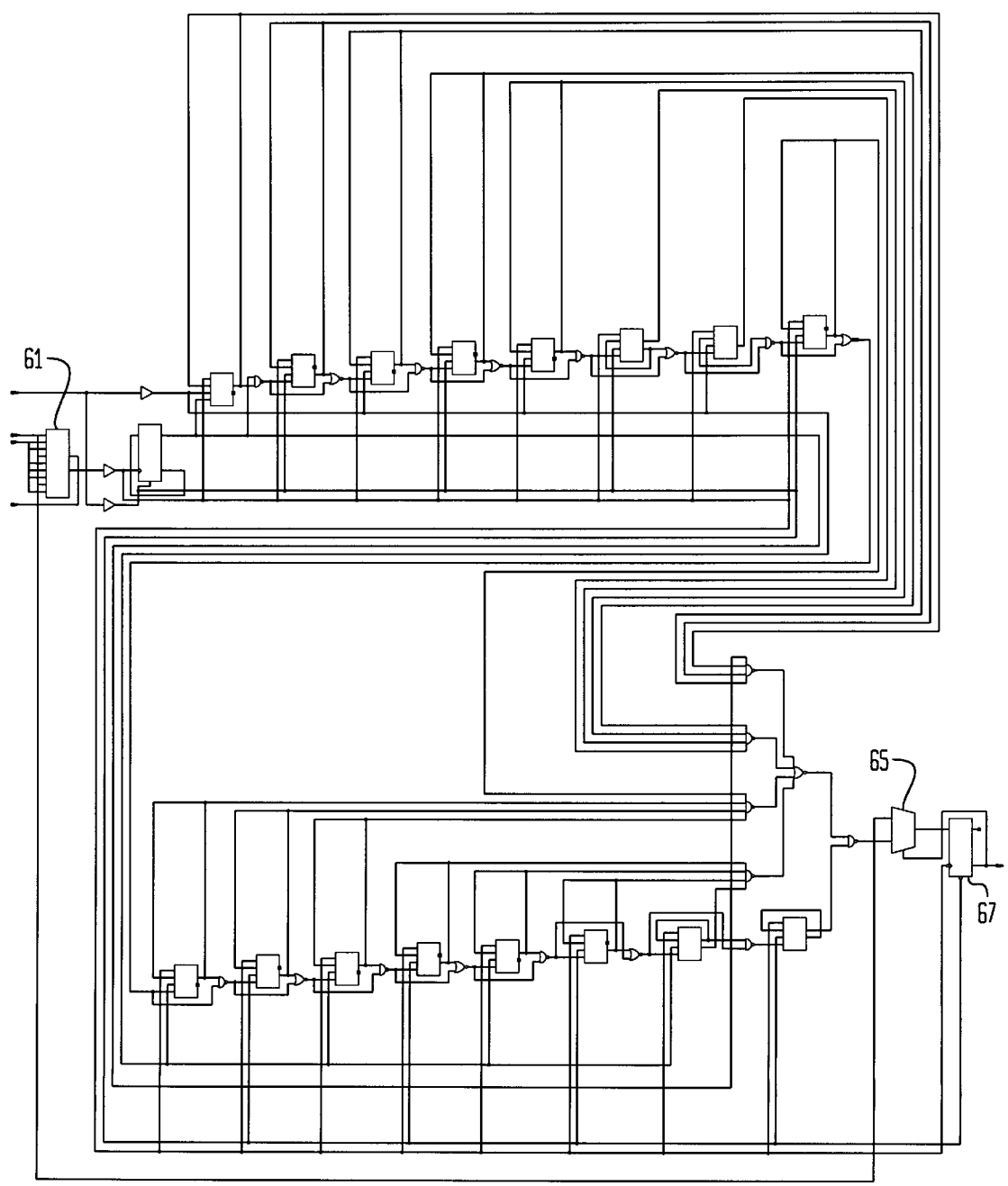
FIG. 6A is a schematic block diagram of the configuration clock counter circuit of FIG. 5.

Referring now to FIG. 6A, a schematic diagram of the configuration clock counter circuit 19 is shown; it includes an optional I/O buffer 61, a counter circuit 63, a multiplexer 65, and a flip flop 67. The configuration clock counter circuit 19 counts the configuratuion clock cycles generated by external logic. The configuration clock counter circuit 19 is designed to count to a predetermined count; the predetermined count should be set high enough to generally simulate the period of time it takes the FPGA to program its configurable elements (i.e., the period of time the FPGA is in its configuration state). It should be noted again that the ASIC does not have any configurable elements and the delay generated by the configuration clock counter circuit 19 is for the benefit of external circuits.

Figure 6B:
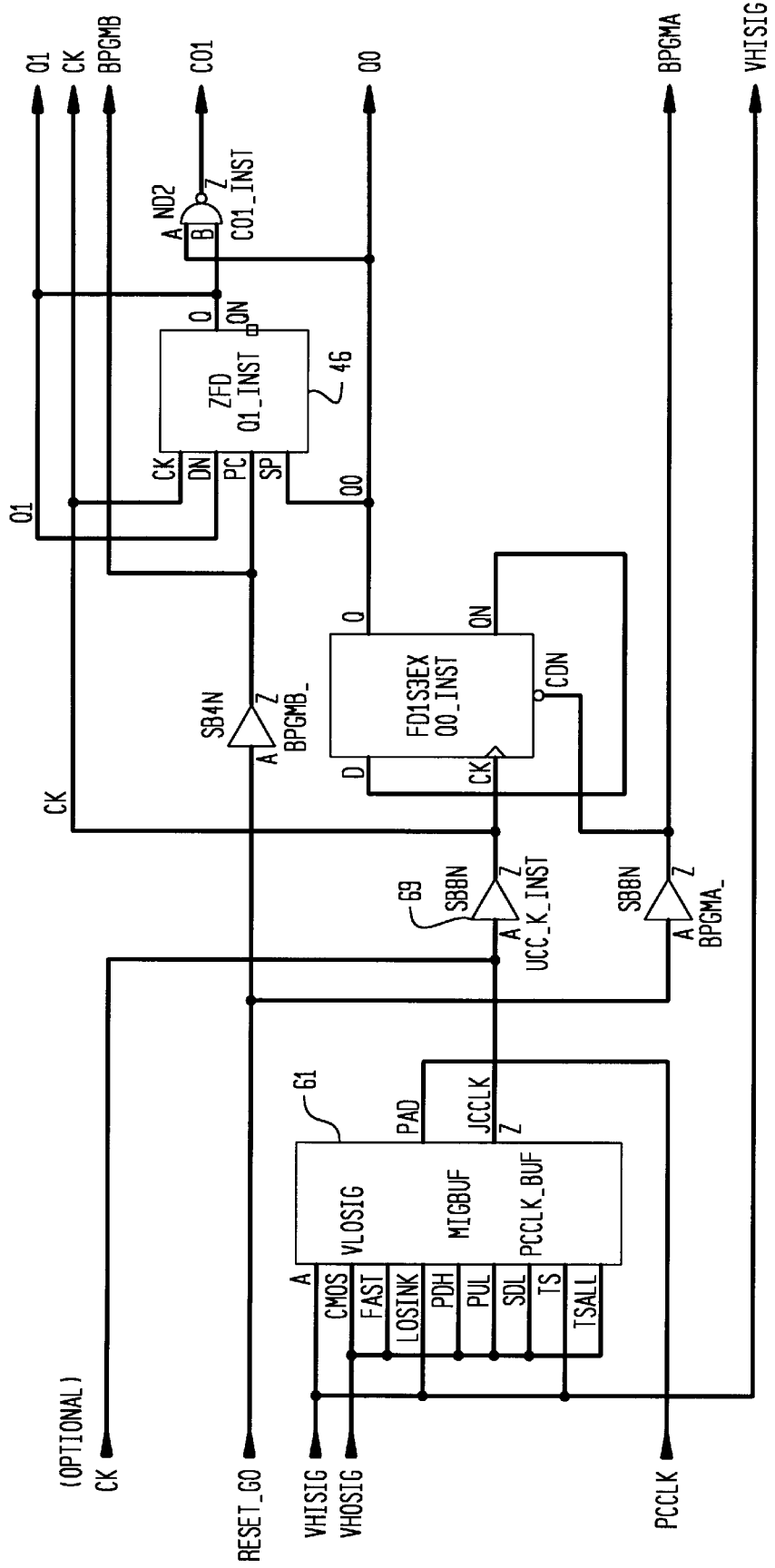
FIGS. 6B–6I are enlarged schematic block diagrams of the configuration clock counter circuit of FIG. 6A.
Figure 6C:
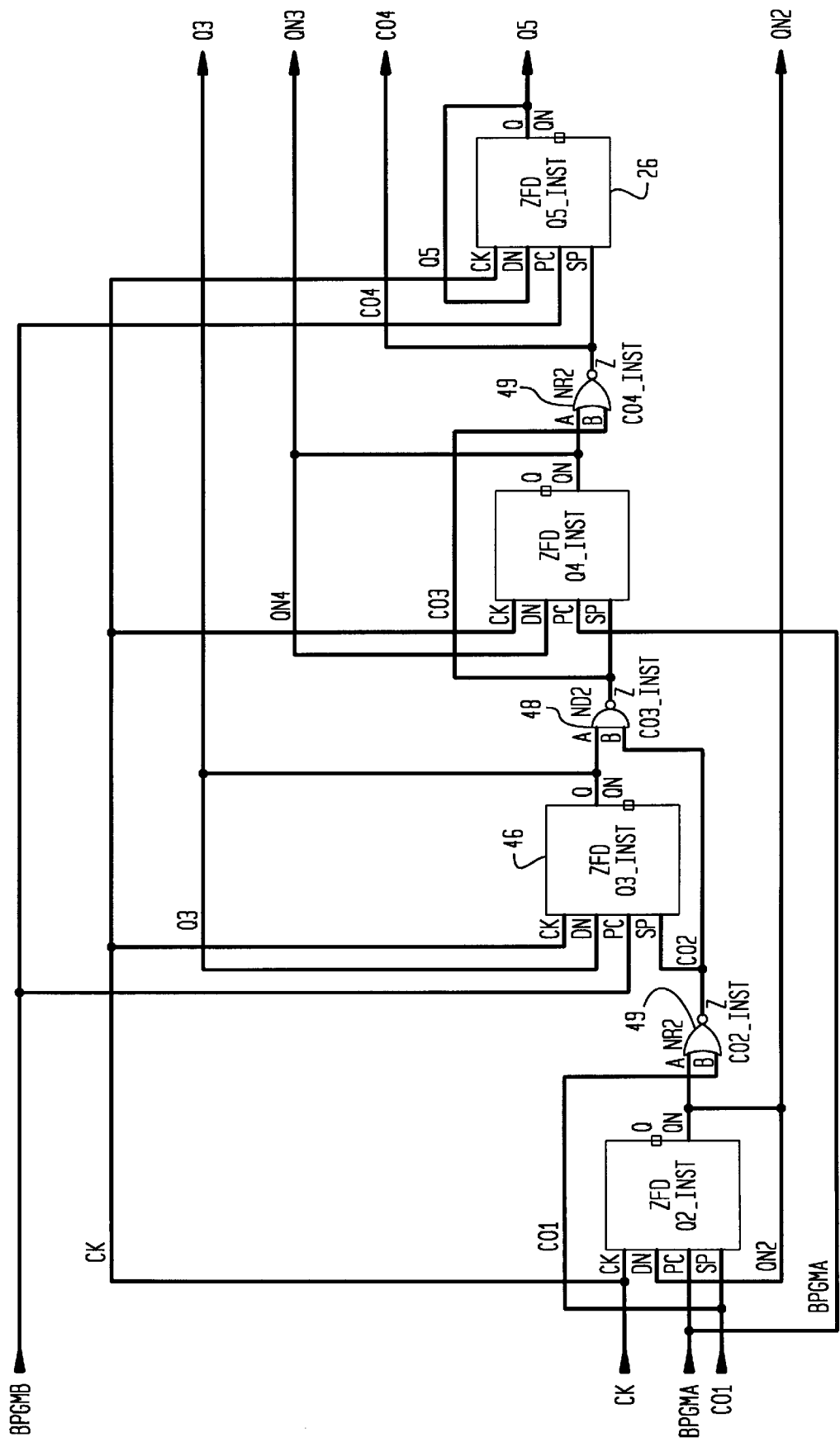
Figure 6D:
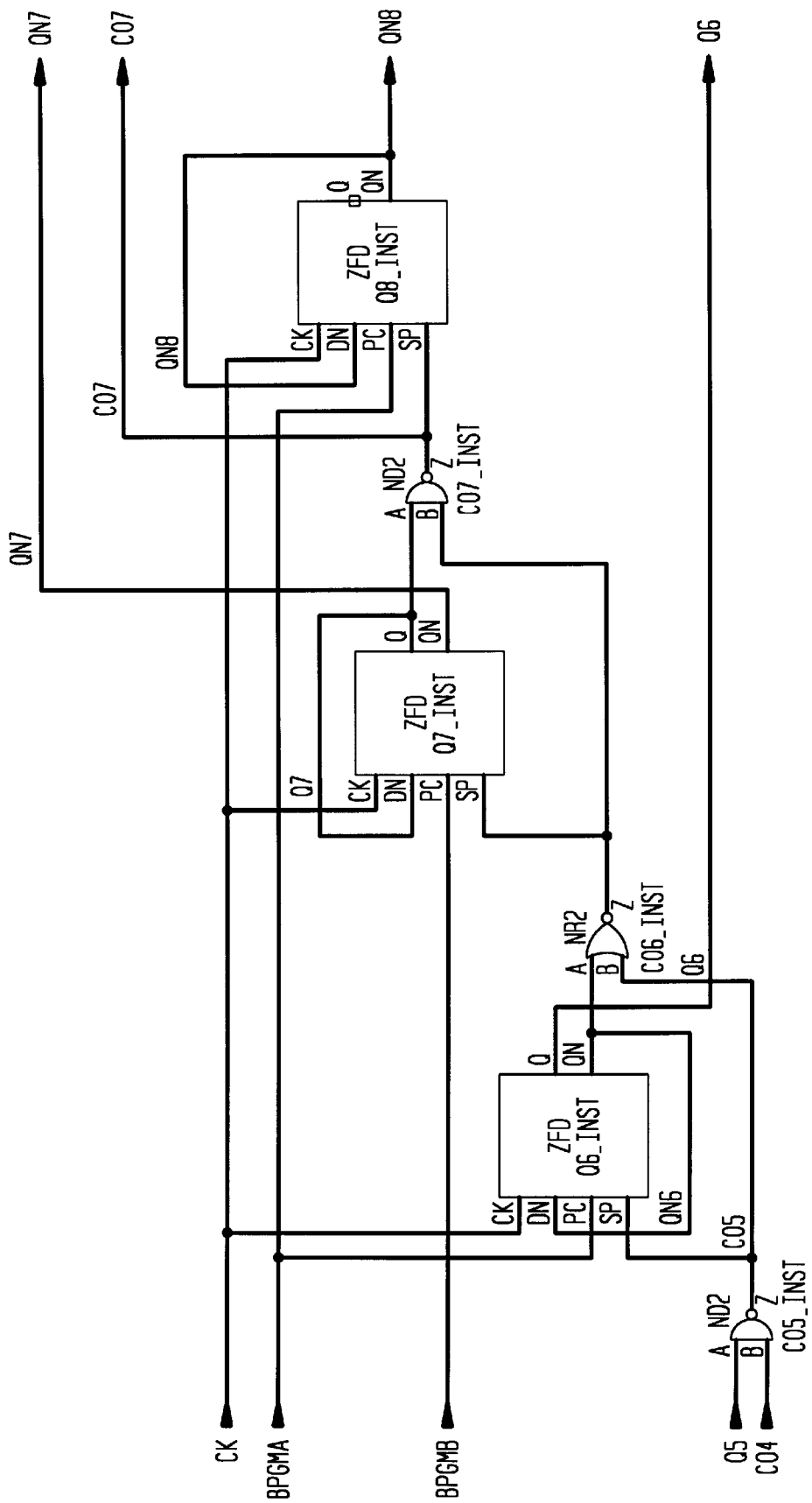
Figure 6E:
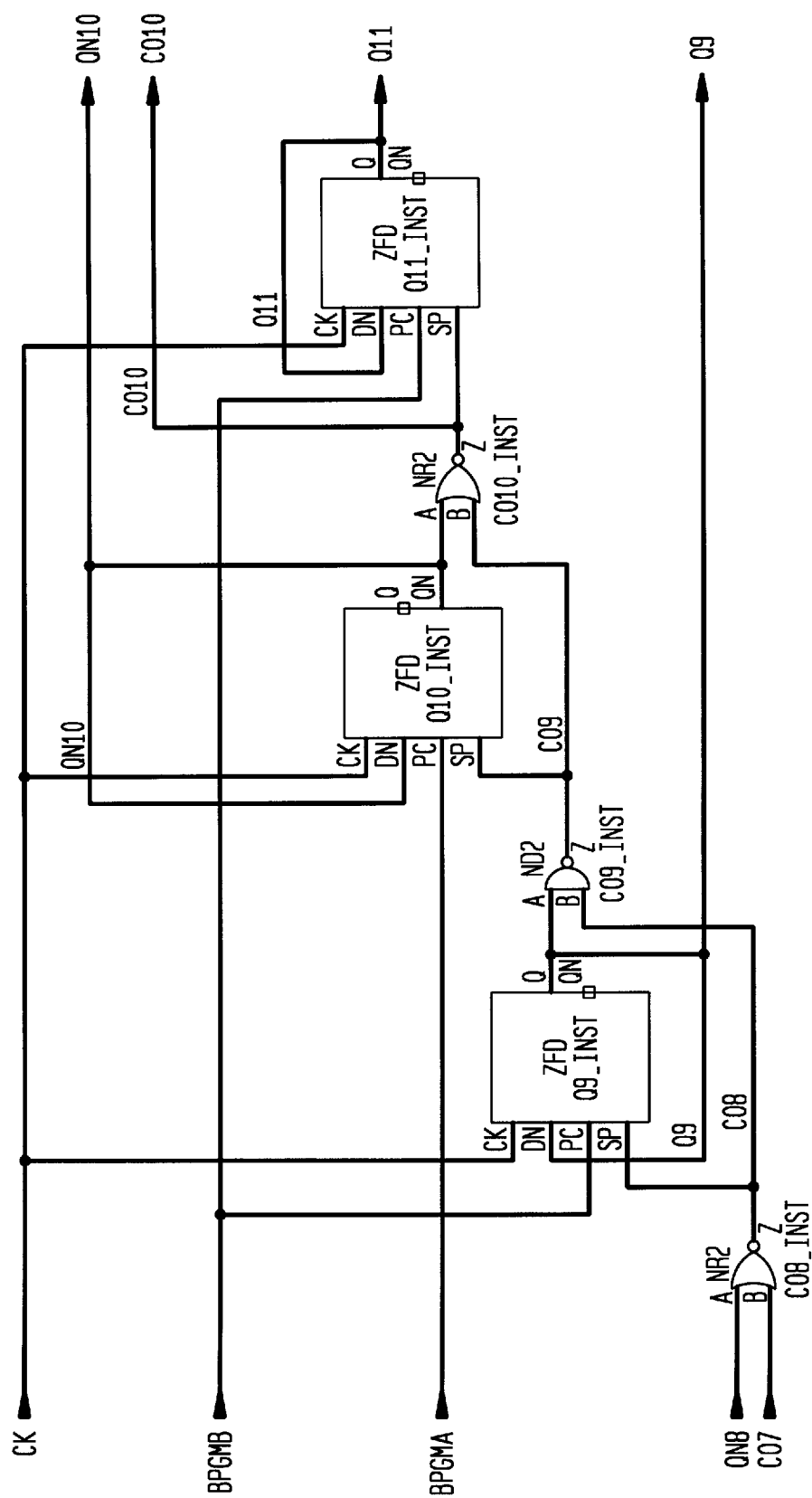
Figure 6F:
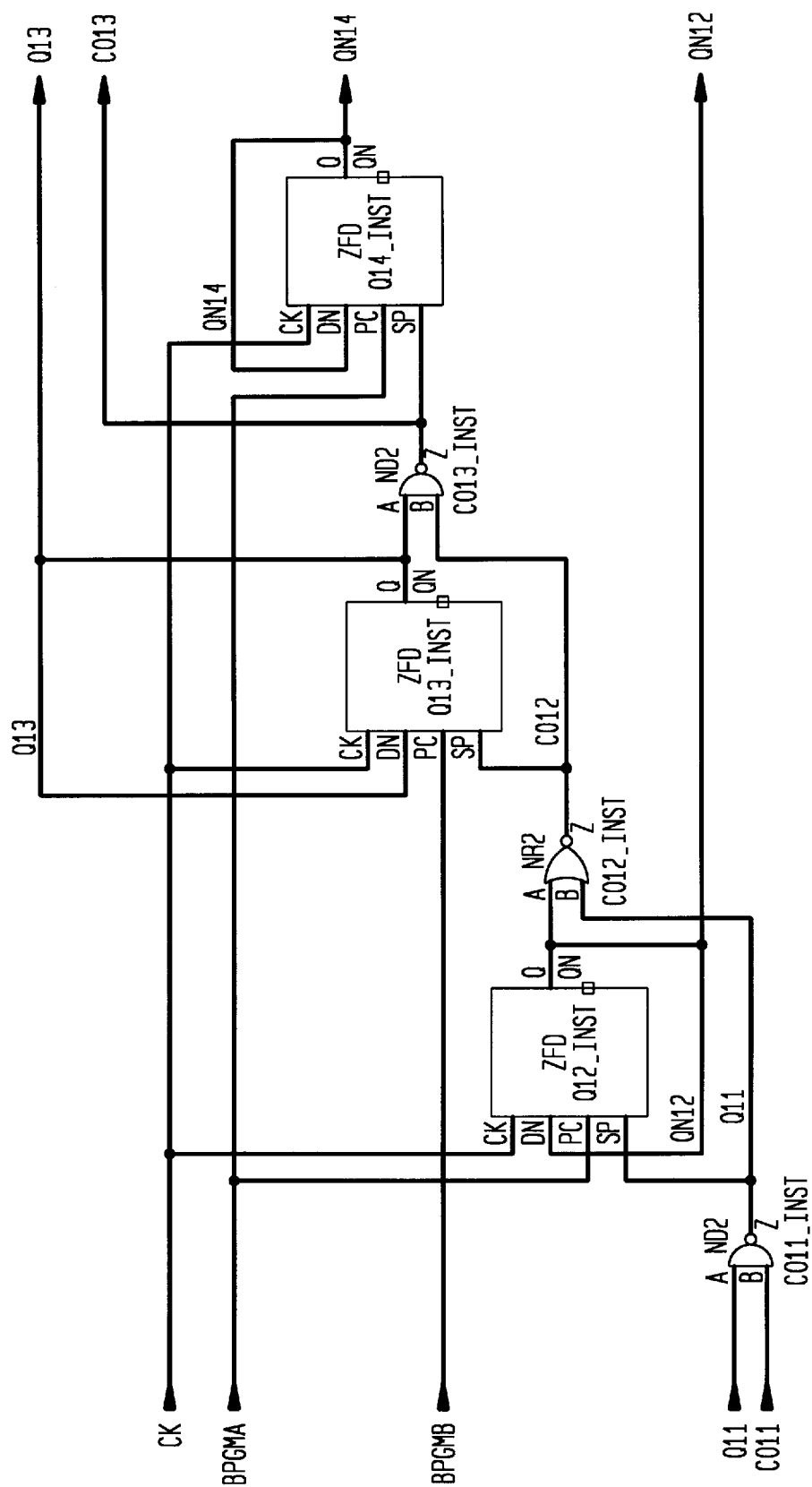
Figure 6G:
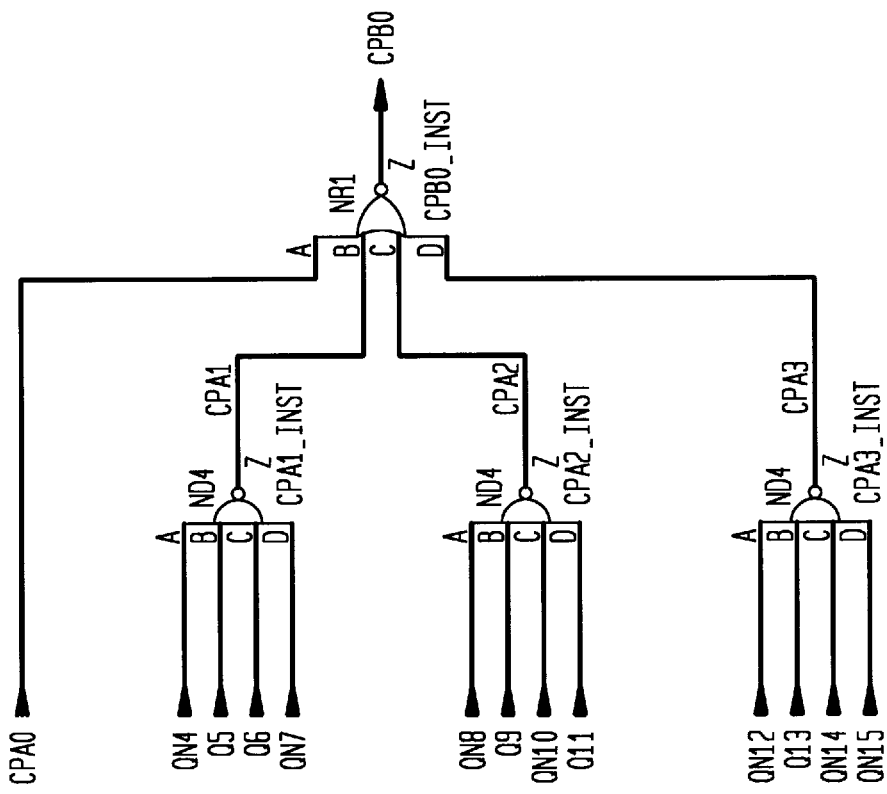
Figure 6H:
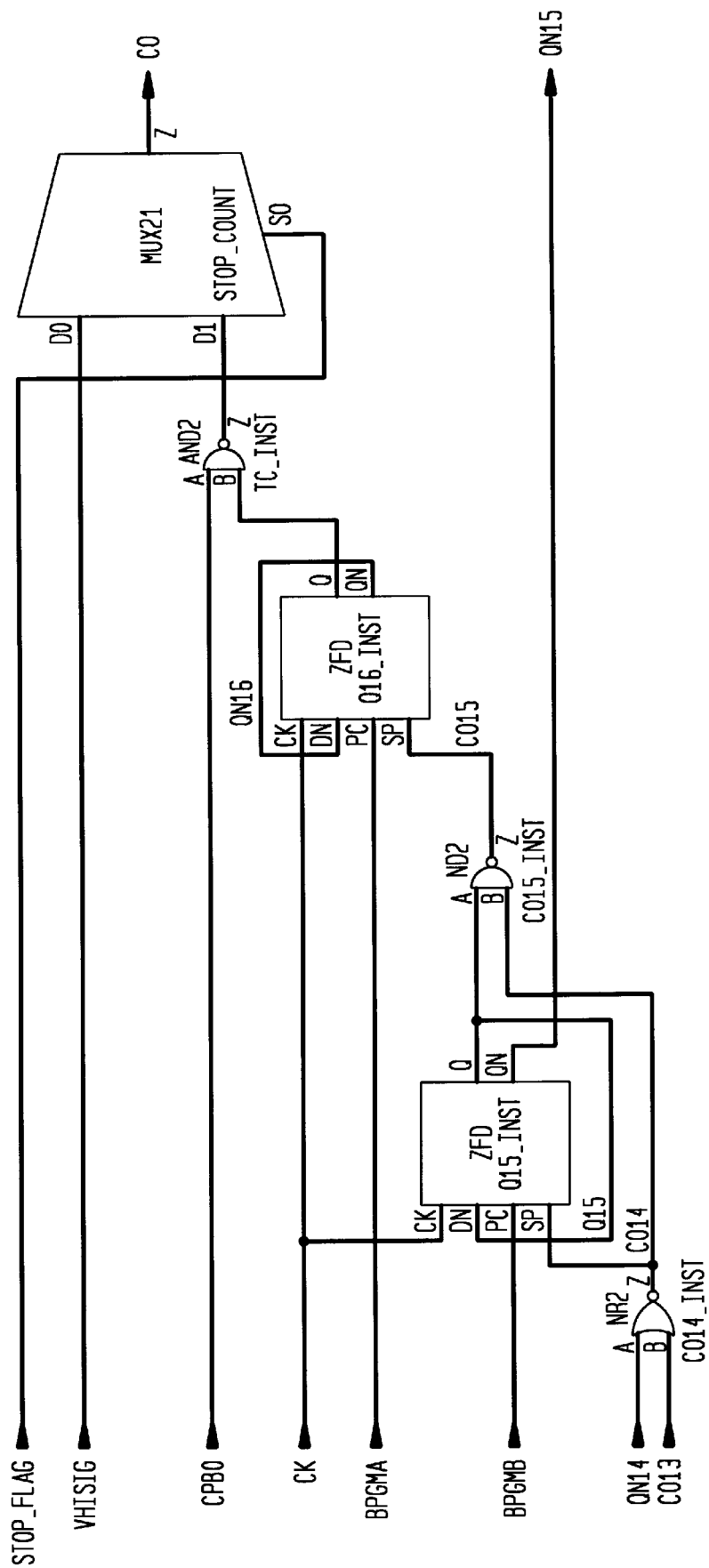
Figure 6I:
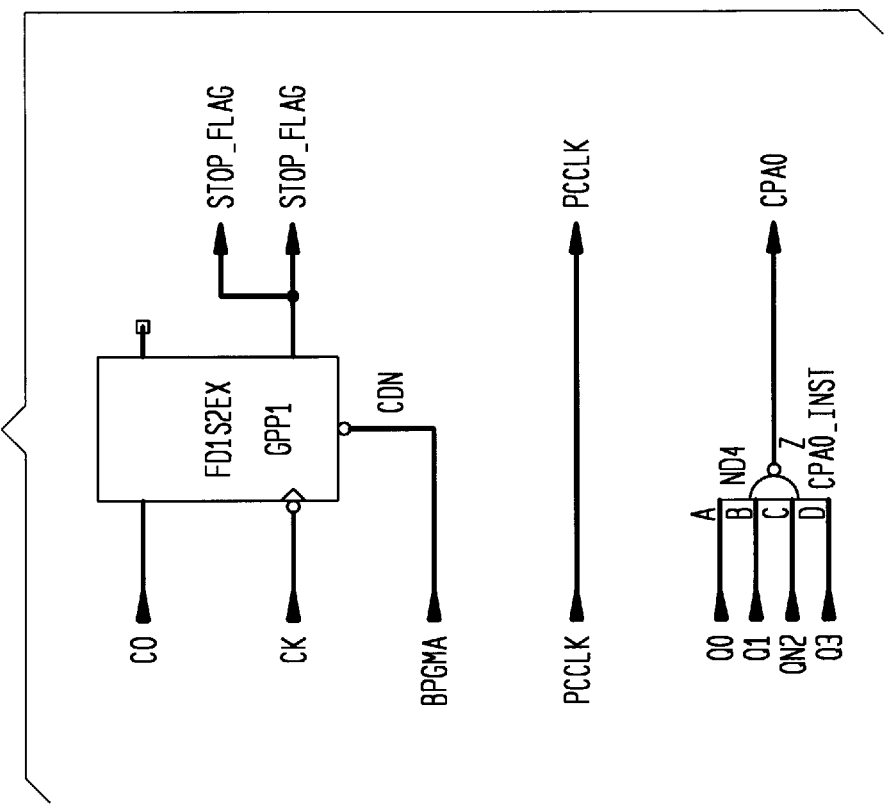

Referring to FIG. 6B, the I/O buffer 61 provides a buffered version of the user-provided configuration clock. If the user does not provide a configuration clock then the buffer may be removed and a clock signal (CK) provided by the ring oscillator 23 of the power-up reset circuit 18 (see FIG. 4) is connected to buffer 69.

The counter circuit 63 includes counting element 46, NAND gates 48 and NOR gates 49. The counter of the configuration clock counter circuit 19 counts to a predetermined count and then causes the STOP_FLAG output to become active. The STOP_FLAG output is connected to the STOP_CLK input of the power-on-reset circuit 18 (see FIG. 3) and to the DONE_END input of the pin emulation circuit 16 (see FIGS. 2 and 6). The STOP_FLAG signal causes the ring oscillator 23, as shown in FIG. 4, to terminate oscillation and causes the primary pin emulation circuit 16 to release control of the configuration mode. The STOP_FLAG also causes the multiplexer 65 to select between the configuration clock counter circuit's 19 predetermined count and a logic high, which holds the STOP_FLAG active until the circuit is reset with the PPRGMN pin or by cycling the power off and back on.

Figure 7:
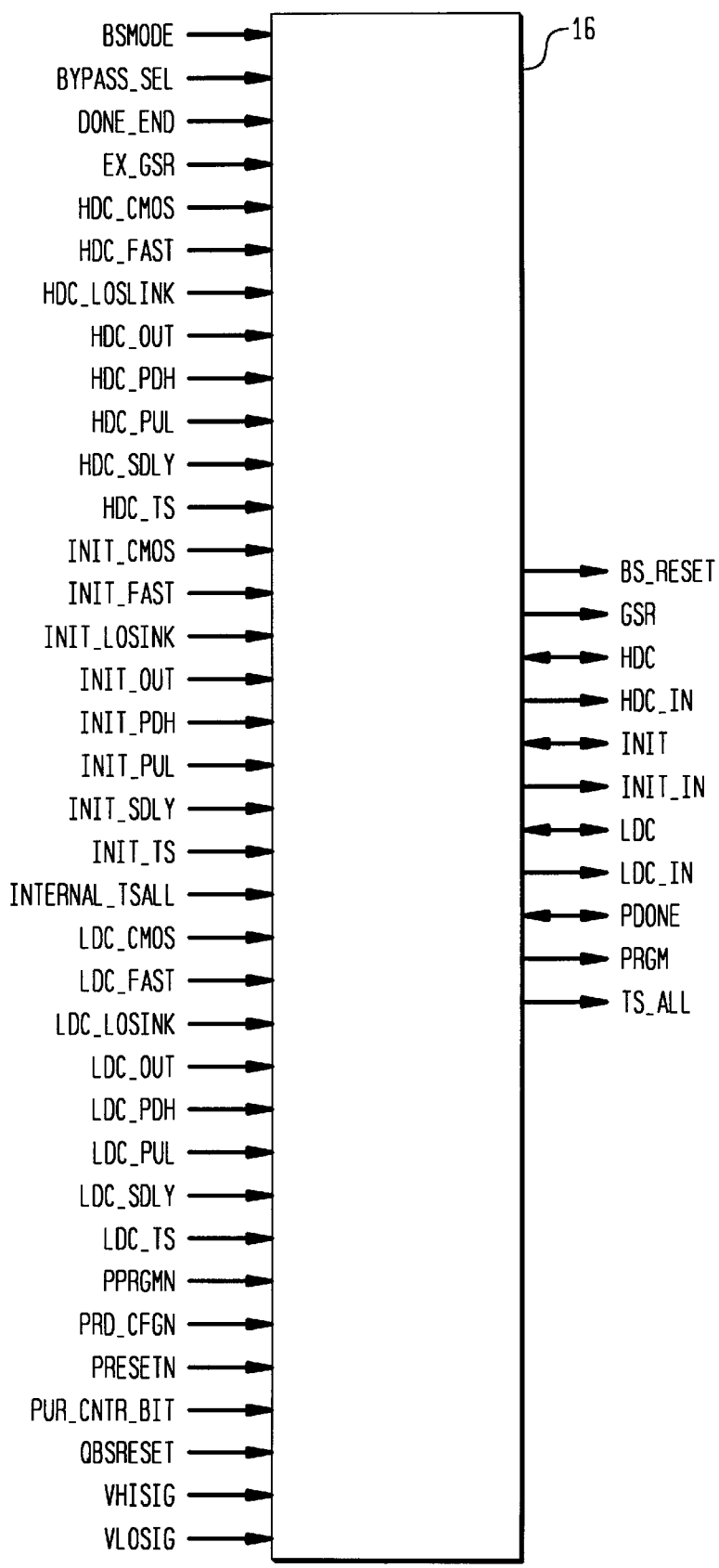
FIG. 7 is a block diagram of the primary pin emulation circuit of FIG. 2 showing its external pin connections.
Figure 8A:
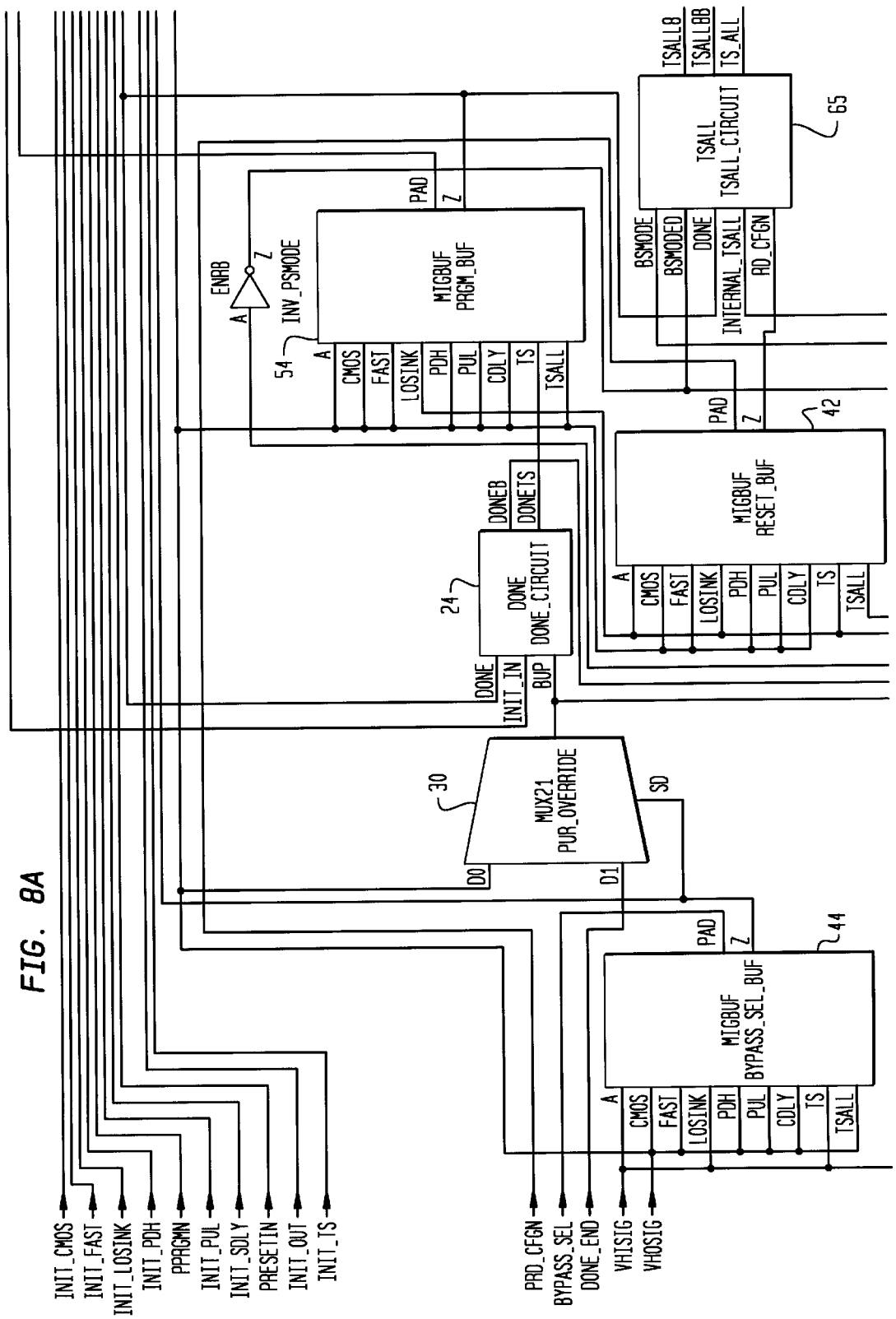
Figure 8B:
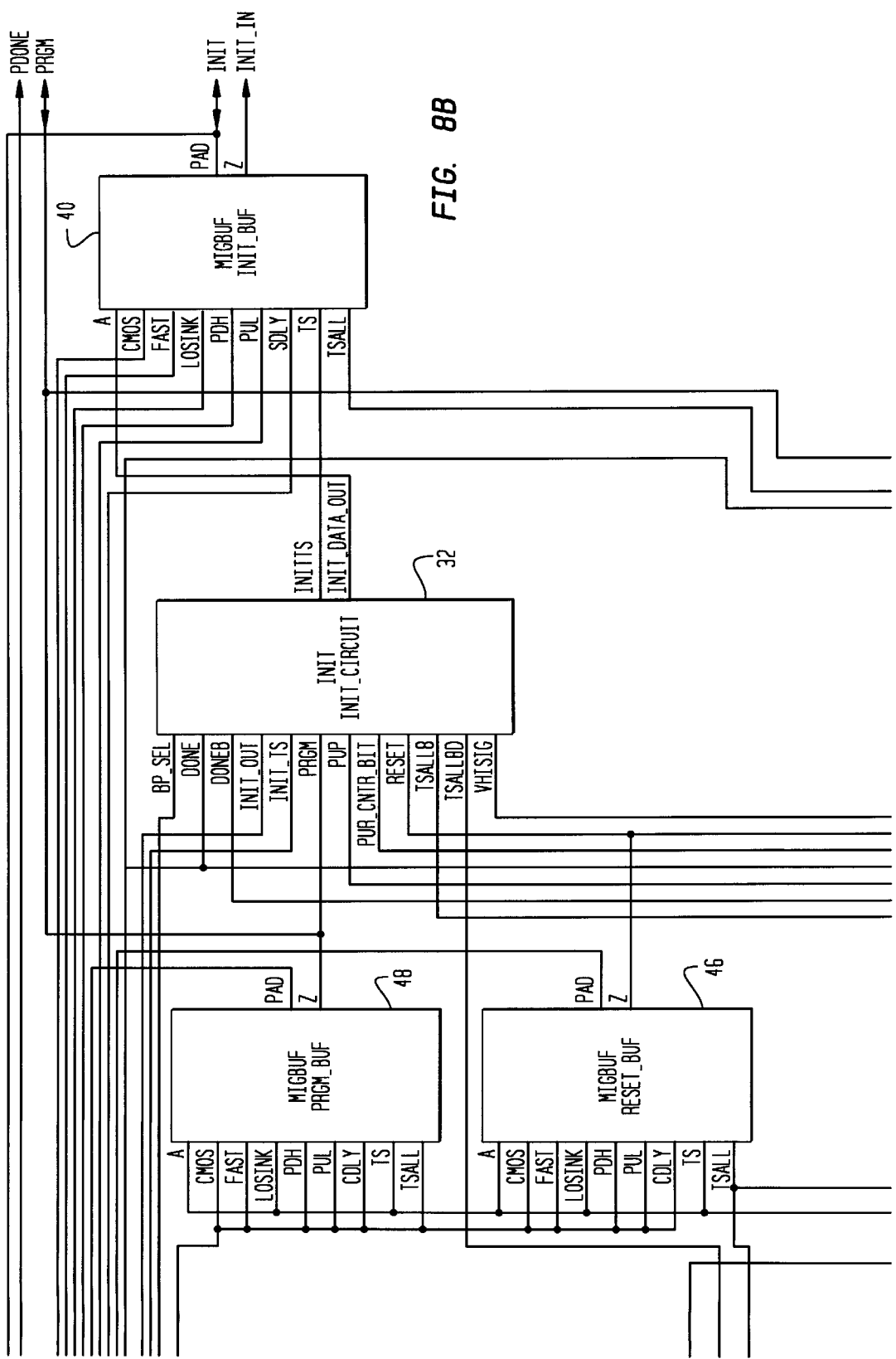
Figure 8D:
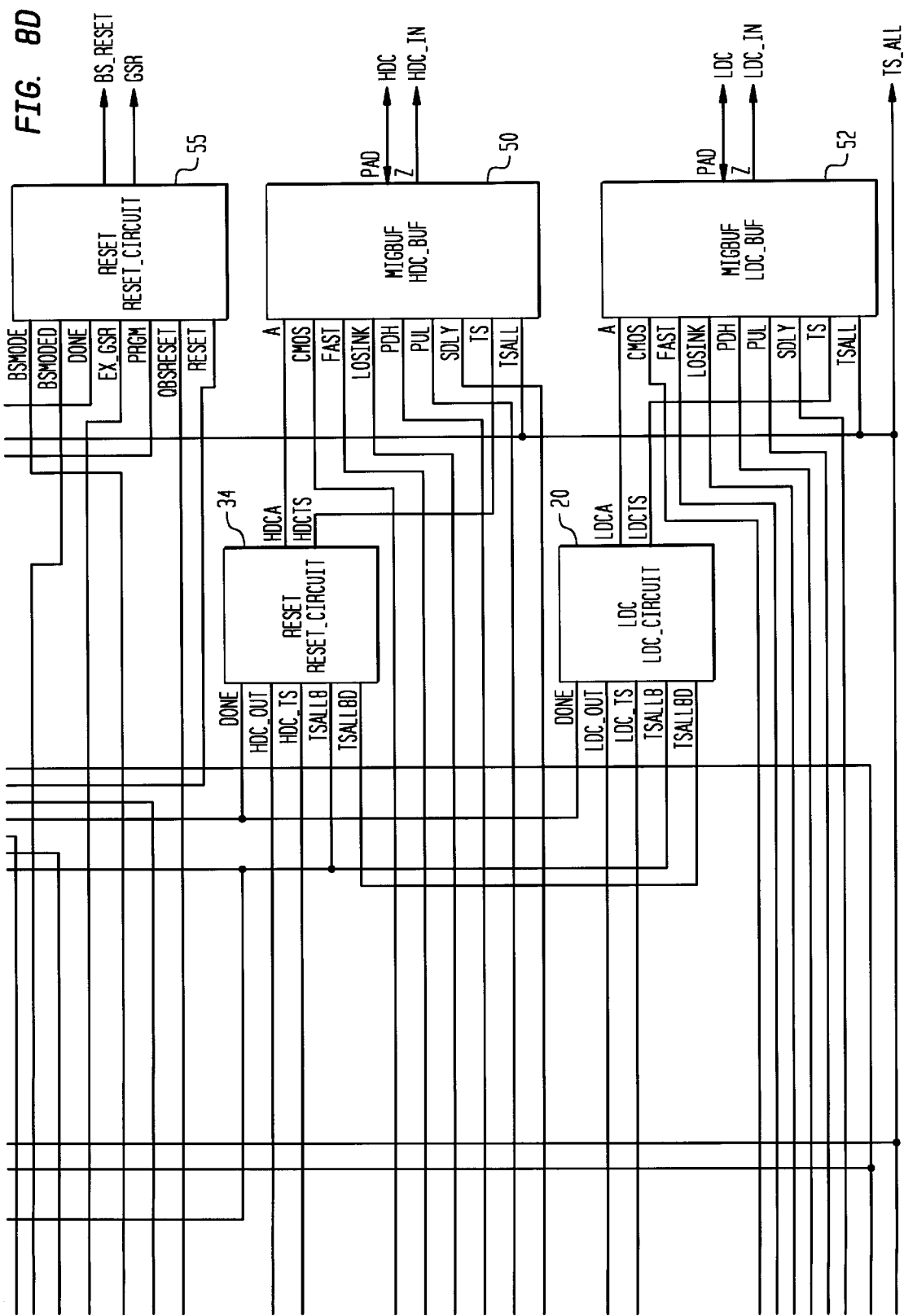

Referring now to FIGS. 7 and 8, the DONE_END input is connected to an input of a bypass select multiplexer 30. The bypass select multiplexer 30 allows the manufacturer of the ASIC to choose either power-on-reset or ground. The manufacturer of the ASIC will choose ground to bypass the pin emulation circuit 16 for the purpose of testing the configuration emulation circuit 14. In its commercial embodiment, the multiplexer 30 always selects the power-on-reset input, i.e., the user does not have this choice.

The primary configuration pin emulation circuit 16 includes eight buffers 40, 42, 44, 46, 48, 50, 52 and 54 to provide buffering functions (e.g., providing sufficient current to drive logic external to the ASIC, level translation to drive circuits on the chip, electrostatic discharge protection, voltage spike protection and noise immunity) for the respective inputs and outputs, and six primary circuits, namely HDC 34, LDC 20, DONE 24, INIT 32, TSALL 57, and RESET 55. Each of the six primary circuits are designed to mimic the corresponding configuration signals of an FPGA.

In contrast with an FPGA, the ASIC using the configuration emulator circuit 14 is operational from power-up and does not need to configure its internal logic. Accordingly, the buffers and primary circuits are typically configured to handle the handshaking and other signals of the logic circuits external to the ASIC. (This may include EPROMs, other FPGAS, microprocessors and any other logic device that communicates with the original FPGA.)

The buffers 40–54 have a plurality of inputs that will handle the input signals to the primary pin emulation circuit 16 and generally correspond to the inputs found on an FPGA. Although most of the user I/O buffers are found in the logic circuit 12, three of the buffers in the primary pin emulation circuit 16 can be used as user I/O buffers after the ASIC leaves the configuration-mimicking state. These three buffers are the HDC buffer 50, LDC buffer 52 and INIT buffer 40.

The HDC buffer 50, the LDC buffer 52 and INIT buffer 40 have several inputs that produce similar results in all three buffers. The HDC_CMOS, the LDC_CMOS and the INIT_CMOS allows the user to operate in transistor-transistor-logic (TTL) mode or to switch to complementary metal oxide semiconductor (CMOS) mode. The HDC_FAST, LDC_FAST, INIT_FAST inputs configure their respective buffers to have a shorter delay than normal. The HDC_SDLY, LDC_SDLY and INIT_SDLY adds a delay to the buffer. The HDC_LOSINK, the LDC_LOSINK and the INIT_LOSINK controls the amount of current the buffer can sink. If active, it limits the amount of current the buffer can sink which effectively slows down the edge rate and reduces noise.

The HDC_PDH, LDC_PDH and the INIT_PDH activates respective pull down transistors 70 in the buffer (see FIG. 21). Similarly, the HDC_PUL, LDC_PUL and INIT_PUL activates a pull-up transistor 72 for each respective buffer. The pull-down or pull-up transistor is connected to $V_{DD}$ or $V_{SS}$ respectively. The pull-down or pull-up transistors effectively act as pull-down or pull-up resistors and pulls the line to the respective voltage when the pin is not driven.

Specific inputs to each buffer are only active when the buffer is configured as a user input/output (I/O) buffer. When the buffers are configured as user I/O, they cooperate with their corresponding primary circuit (HDC 34, LDC 20 or INIT circuit 32) to mimic specific conditions of the FPGA.

Figure 9:
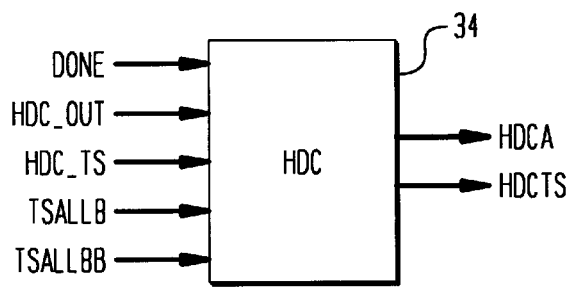
FIG. 9 is a block diagram of a high during configuration circuit which is a part of the pin emulation circuit of FIG. 8, showing its external pin connections.
Figure 10:
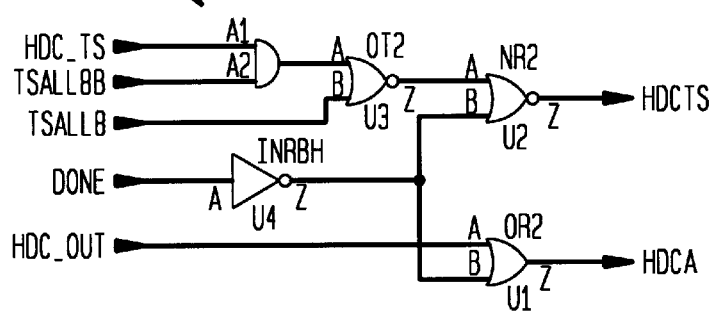
FIG. 10 is a schematic block diagram of the high during configuration circuit of FIG. 9.
Figure 11:
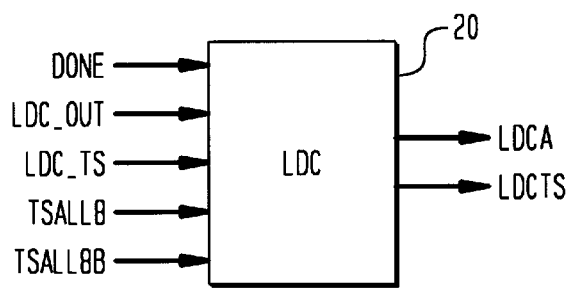
FIG. 11 is a block diagram of a low during configuration circuit which is a part of the pin emulation circuit of FIG. 8, showing its external pin connections.
Figure 12:
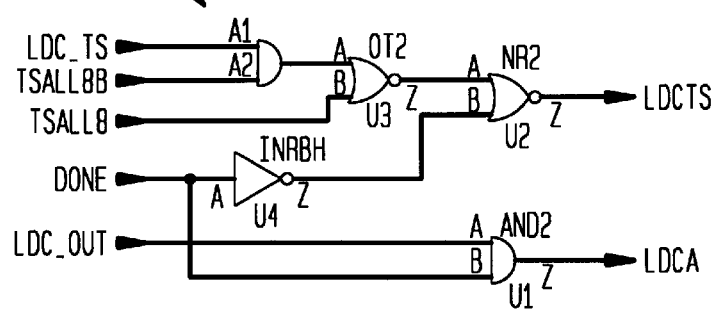
FIG. 12 is a schematic block diagram of the low during configuration circuit of FIG. 11.
Figure 13:
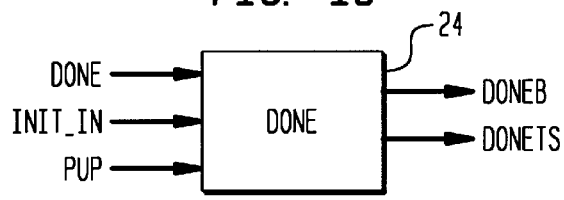
FIG. 13 is a block diagram of a DONE circuit which is a part of the pin emulation circuit of FIG. 8, showing its external pin connections.

Referring to FIGS. 9 and 10, the inputs, outputs and internal logic of the high during configuration (HDC) circuit 34 are shown. Similarly, the inputs, outputs and internal logic for the LDC circuit 20 and INIT circuit 32 are shown in FIGS. 11, 12, 15 and 16.

The HDC_OUT, LDC_OUT and INIT_OUT allow the input of the buffer to go through the buffer to its respective output (i.e., HDC, LDC or INIT pins). The HDC_TS, LDC_TS and the INIT_TS are the tri-state control inputs for each respective buffer. When the buffers are configured as user I/O, the HDC_TS, LDC_TS and INIT_TS lines determine whether the respective buffer is an input or an output.

At any time after configuration, the user can drive PRD_CFGN pin low and cause all user I/O pins to be tri-stated, thus emulating the FPGA.

Figure 17:
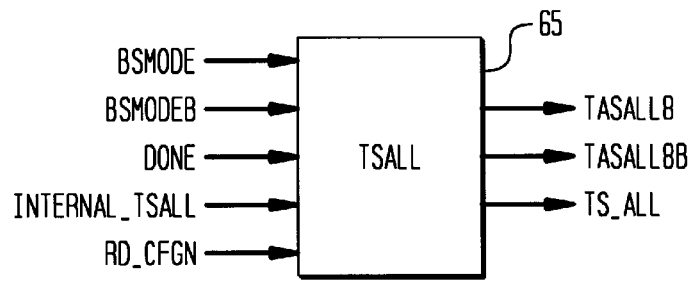
FIG. 17 is a block diagram of the tri-state all (TSALL) circuit which is a part of the pin emulation circuit of FIG. 8, showing its external pin connections.
Figure 18:
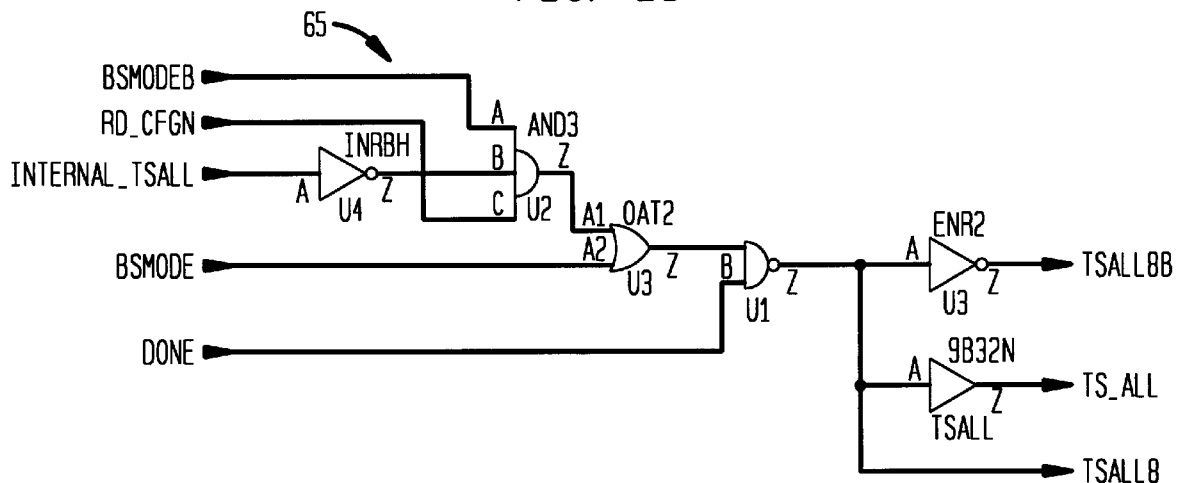
FIG. 18 is a schematic block diagram of the TSALL circuit of FIG. 17.
Figure 19:
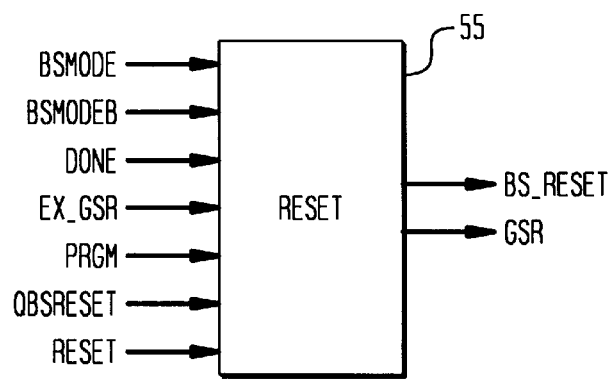
FIG. 19 is a block diagram of an RESET circuit which is a part of the pin emulation circuit of FIG. 8, showing its external pin connections.
Figure 20:
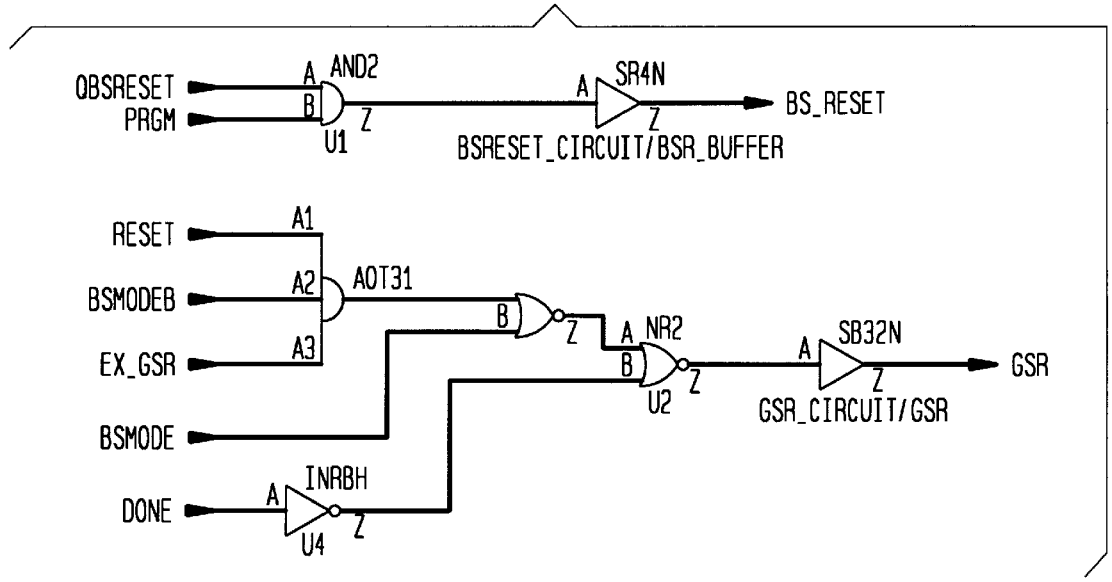
FIG. 20 is a schematic block diagram of the RESET circuit of FIG. 19.

Referring to FIGS. 8, 17 and 18, when in operational mode, the INTERNAL_TSALL input is connected to TSALL circuit 57. The TSALL circuit 57 allows the user to tri-state all user I/O buffers on the ASIC (including those in the logic circuitry 12) with an internal signal.

When in operational mode, the PRD_CFGN input allows the user to tri-state all user I/O buffers on the ASIC (including those in the logic circuitry 12) with an external signal (i.e., the user must drive the input externally).

The VHISIG and the VLOSIG provide constant voltage signals to the configuration emulator circuit 14. The VHISIG is always high and the VLOSIG is always low.

The BSMODE input comes from a boundary scan controller (this is optional) and is connected to the TSALL circuit 57 and the RESET circuit 55. When in boundary scan mode, it disables the PRESETN and the PRD_CFGN pins. The boundary scan is used to test interconnects on the circuit board and is generally used only when every chip on the circuit board has boundary scan.

The BYPASS-SEL input bypasses the power-on-reset counter 18 and the configuration clock counter 19, and is used to test or simulate specific operating conditions. That is, instead of waiting for the counter to time out, the user or manufacturer can ignore the counters and test the primary pin emulation circuit 16.

The EX_GSR input is connected to RESET circuit 55. When emulating an FPGA's operational mode, the EX_GSR (external global reset) input to the configuration emulator circuit 14 allows the customer the flexibility to use any I/O pin as a RESET pin other than the dedicated PRESETN pin.

The operation of the configuration emulation circuit 14 will now be described. When power is provided to the ASIC 10, the power-on-reset circuit 18 is activated. The power-on-reset circuit sends a signal over the GO_RESET line to the primary pin emulation circuit 16 placing them in a state that is meant to mimic the initialization state of an FPGA and causing a reset of the configuration clock counter circuit 19.

The initialization state of the primary pin emulation circuit 16 resets the boundary scan circuit, resets all user internal logic of the ASIC, and tri-states all user I/O buffers except for the high during configuration (HDC) buffer 50, the low during configuration (LDC) buffer 52, and the INIT buffer 40. (Note that the DONE buffer 54 Program (PPRGMN) buffer 48, reset (PRESETN) buffer 46, PRD_CFGN buffer 42 and BY PASS SELECT buffer 44 are not tri-stated but they are not USER I/O).

Figure 14:
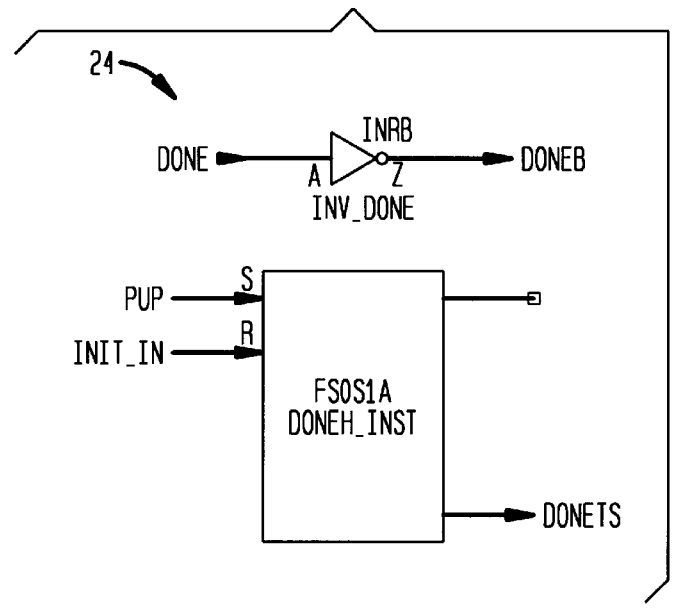
FIG. 14 is a schematic block diagram of the DONE circuit of FIG. 13.
Figure 15:
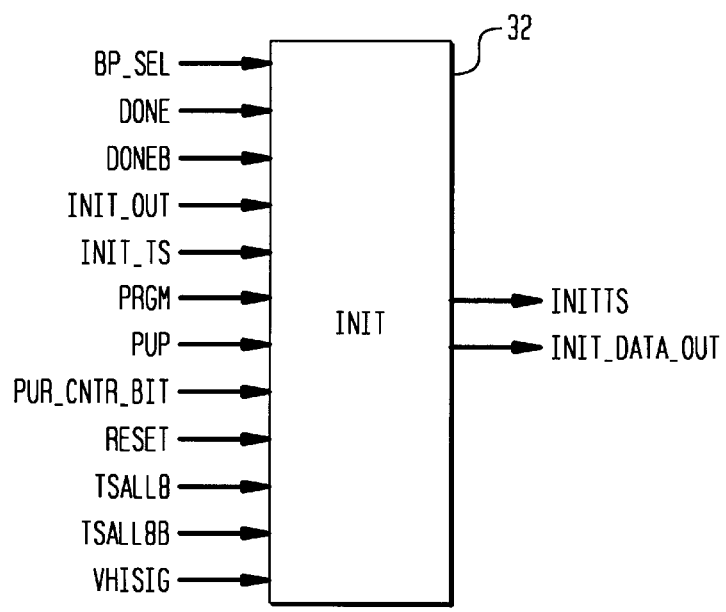
FIG. 15 is a block diagram of an INIT circuit which is a part of the pin emulation circuit of FIG. 8, showing its external pin connections.
Figure 16:
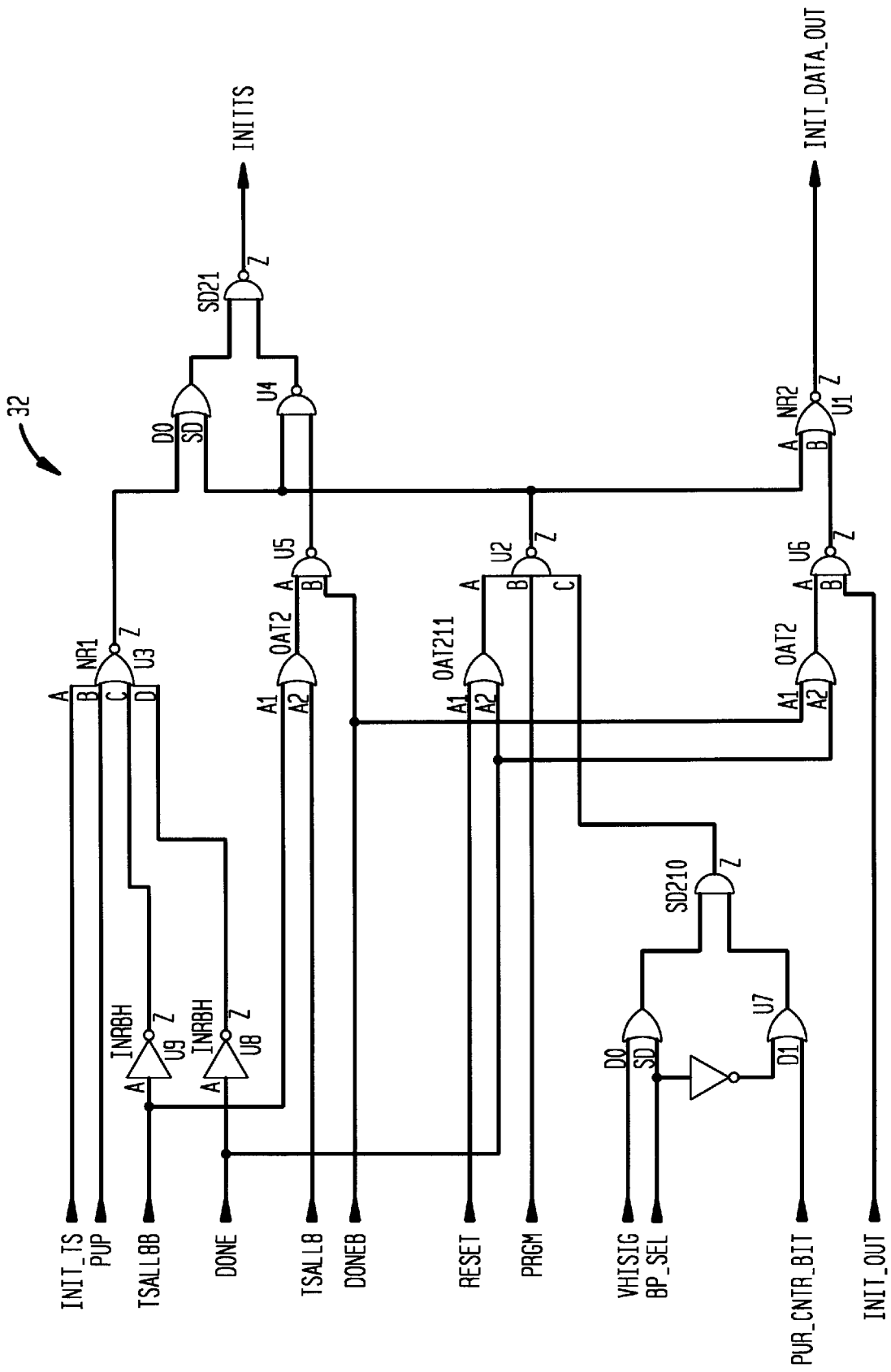
FIG. 16 is a schematic block diagram of the initialization (INIT) circuit of FIG. 15.

The original FPGA keeps the DONE output low until the FPGA goes into its operational mode. The external circuits will sense when DONE goes high which enables operating functions on the board. Therefore, the configuration emulation circuit 14 must keep the DONE output low during the mimicked initialization, configuration and start-up states. In order to accomplish this, the output of the DONE buffer of the primary configuration pin emulation circuit 16 is kept low until the configuration clock counter circuit 19 times out. As seen in FIGS. 8 and 14, this is accomplished with the DONE circuit 24 including a latch 62. As long as the configuration clock counter circuit 19 is active, i.e., the STOP_FLAG pin is high, DONE will stay low.

The HDC and LDC I/O buffers are commonly utilized by the user to provide known signals to circuits external to the ASIC. The HDC pin is made high during initialization and stays high throughout the initialization, configuration and start-up states of the FPGA. Therefore, the primary pin emulation circuit 16 must keep the HDC pin high until the DONE pin goes high and the ASIC 10 is in its operational mode (i.e., during the period of time the circuits external to the ASIC 10 would have expected to detect HDC high). As long as the configuration clock counter circuit 19 is active or DONE is low (i.e., the STOP_FLAG pin is high) HDC will stay high.

Similarly, the LDC pin is made low during initialization and stays low throughout the initialization, configuration and startup states of the FPGA. Therefore, the primary pin emulation circuit 16 must keep the LDC pin low until the DONE pin goes high and the ASIC 10 is in its operational mode (i.e., during the period of time the circuits external to the ASIC expect to see LDC high). As long as the configuration clock counter 19 is active or DONE is low (i.e., the STOP_FLAG pin is high) LDC will stay low.

The INIT buffer is low for a period of time during initialization then goes high. The INIT pin must go high before the DONE pin in order to simulate the initialization state of an FPGA. The INIT pin is driven from an intermediate flip-flop 41 of the power up reset timer 18.

During configuration, i.e., when DONE is low, toggling the dedicated reset pin (PRESETN) from low to high will force the primary pin emulation circuit 16 back into its initialization mimicking state (this means that the INIT pin will go low for a period of time and then goes high). That is, the INIT pin tracks the dedicated reset pin at that particular time. (Note that if DONE is high you are not in configuration.)

At a predetermined count of the power-on-reset counter 18, QINIT will go high and cause the INIT pin to become tri-stated wherein the INIT pin functions as an open collector I/O and is pulled high by a pull-up resistor (see FIG. 21). (Note that the INIT output must go high well before DONE goes high.)

If the user wishes to stay in configuration for a period of time longer than the configuration clock counter circuit 19, the user must drive the INIT pin low before the configuration clock counter circuit times out forcing the ASIC 10 into initialization regardless of the timing of the configuration clock counter circuit 19. The DONE circuit 24 includes the three inputs and two outputs as shown in FIG. 14.

The DONE buffer is also an open collector I/O buffer. Accordingly, a customer can drive DONE low and the primary pin emulation circuit 16 will stay in configuration regardless of the configuration clock counter. When the customer wishes to reconfigure, the PPRGMN pin is driven low forcing the HDC buffer to go high and the LDC buffer to go low; DONE goes low, INIT goes low and all user I/O's (including buffers) are tri-stated; the boundary scan circuits are reset and the internal circuits are reset. The PPRGMN pin is controlled by the user, generally via an external micro-processor. The program pin is used to mimic the reconfiguration state of the FPGA. DONE and INIT can only hold it in configuration, program can send it into reconfiguration (i.e., reconfigure).

After the configuration clock counter circuit is timed out, and the customer has not intentionally kept the circuit in configuration, the dedicated reset pin (PRESETN) or the alternate reset signal input (EX_GSR) resets all internal flip-flops. The customer can tri-state all user I/O buffers when not in configuration, by either pulling the PRD_CFGN pin low or by driving an INTERNAL_TS ALL signal high.

The DONE pin causes two user configurable I/O to function as HDC and LDC. Once the DONE pin goes high, these two pins become user I/O. If an external DONE or INIT signal is applied to the DONE or INIT pins before the configuration clock counter circuit times out, then the subject invention can be held in reset beyond the length of the configuration clock counter. Since the INIT and DONE pins are open collector type pins, once all INIT and DONE pins on the board are high, the subject invention functions as a configured FPGA.

When the invention is implemented in an ASIC, the user realizes a savings in manufacturing costs. In addition, a further cost saving is achieved since the customer does not have to modify board software or board design by reducing the size of the silicon (i.e., reduction in the number of gates and interconnect wires).

While the invention has been described with reference to specific embodiments in the interest of complete definiteness, it would be understood that it may be embodied in a variety of forms different from those specifically shown and described without departing from the spirit and scope of the invention.

We claim:

1. An integrated circuit including a circuit for emulating the inputs and outputs of a field programmable gate array (FPGA), said FPGA having a programmable stage that is initiated during power-up and an operational stage that is initiated after the programmable stage, said circuit for emulating comprising:
  a) counter means, activated when power is supplied to the circuit for emulating, for counting for a predetermined period of time, said counter means generating a signal when the end of said predetermined time period is reached; and
  b) pin emulation means in communication with said counter means for generating output signals, that simulate the programmable stage signals occurring at the FPGA's outputs during the time said counter means is counting, and for receiving input signals and generating responsive output signals that simulate, the operational stage signals occurring at the FPGA's outputs after said counter reaches said predetermined time.

2. An integrated circuit including a circuit for emulating the inputs and outputs of a field programmable gate array (FPGA), said FPGA having a programmable stage that is initiated during Power-up and an operational stage that is initiated after the programmable stage, wherein the programmable stage of the FPGA includes an initialization state and a configuration state, said circuit for emulating comprising:
  a) counter means, activated when power is supplied to the circuit for emulating, for counting for a predetermined period of time, said counter means generating a signal when the end of said predetermined time period is reached, said counter means further comprising a power-on-reset circuit and a configuration clock counter circuit, said power-on-reset circuit including a first counter for counting to a first predetermined count, said first predetermined count generally corresponding to the period of time said FPGA is in its initialization state, and a means for generating a first command signal when said first counter reaches said first predetermined count, said configuration clock counter circuit including a second counter for counting to a second predetermined count, said second predetermined count generally corresponding to the period of time said FPGA is in its configuration state, and a means for generating a second command signal when said second counter reaches said second predetermined count; and
  b) pin emulation means in communication with said counter means for generating output signals that simulate the programmable stage signals occurring at the FPGA's outputs during the time said counter means is counting, and for receiving input signals and generating responsive output signals that simulate the operational stage signals occurring at the FPGAs outputs after said counter reaches said predetermined time, said pin emulation means detecting said first command signal and generating an initialization done signal in response thereto, and detecting said second command signal and generating a configuration done signal in response thereto.

3. The invention of claim 2, wherein the configuraion clock counter circuit counts configuration clock cycles that are generated by external logic circuits.

4. The invention of claim 2 further comprising logic circuitry for accepting input signals from external logic circuits and, in response thereto, outputting signals substantially identical to the outputs of said FPGA in its programmable stage.

5. The invention of claim 2 wherein the circuit for emulating is implemented in an application specific integrated circuit.

6. The invention of claim 2 wherein the circuit for emulating is implemented in a gate array.

7. A circuit for emulating the configuration pin inputs and outputs of a field programmable gate array (FPGA), said FPGA having an initialization state and a configuration state, said FPGA producing output signals to indicate to circuits external to the FPGA the present state of the FPGA, said circuit for emulating comprising:
  a) a power-on-reset circuit for counting to a first predetermined count, said first predetermined count generally corresponding to a period of time said FPGA is in its initialization state, said power-on-reset circuit being activated when power is supplied to the circuit for emulating;
  b) a configuration clock counter circuit for counting to a second predetermined count, said second predetermined count generally corresponding to a period of time said FPGA is in its configuration state; and
  c) pin emulation means that communicates with said power-on-reset circuit and said configuration clock counter circuit for providing FPGA initialization-mimicking output signals to the external circuits when the power-on-reset circuit is counting to the first predetermined, and for providing FPGA configuration-mimicking output signals to the external circuits when the configuration clock counter circuit is counting to the second predetermined count.

8. The invention of claim 7 wherein the power-on-reset circuit further comprises means for generating a first command signal when said power-on-reset circuit reaches said first predetermined count, said pin emulation means detecting said first command signal and generating an initialization done signal in response thereto.

9. The invention of claim 8 wherein the configuration clock counter circuit further comprises means for generating a second command signal when said configuration clock counter circuit reaches said second predetermined count, said pin emulation means detecting said first command signal and generating an configuration done signal in response thereto.

10. The invention of claim 9 wherein the circuit for emulating is implemented in a gate array.

11. A circuit for emulating an Optimizable Reconfigurable Cell Array (ORCA) field programmable gate array (FPGA), said FPGA having a programmable stage that is initiated during power-up and an operational stage that is initiated after the programmable stage, said programmable stage having an initialization state, a configuration state, a start-up state and a reconfiguration state, said emulation circuit comprising:
  a power-on-reset circuit for counting to a first predetermined count, said first predetermined count generally corresponding to a period of time said FPGA is in its initialization state, said power-on-reset circuit including means for generating a first command signal when said power-on-reset circuit reaches said first predetermined count, said power-on-reset circuit being activated when power is supplied to the circuit for emulating;
  a configuration clock counter circuit for counting to a second predetermined count, said second predetermined count generally corresponding to a period of time said FPGA is in its configuration state, said configuration clock counter circuit including means for generating a second command signal when said configuration clock counter circuit reaches said second predetermined count; and a pin emulation circuit for detecting said first and second command signals, for providing FPGA initialization-mimicking output signals to external circuits until the pin emulation circuit detects the first command signal, and for providing FPGA configuration-mimicking output signals to external circuits until the pin emulation circuit detects the second command signal.

12. The invention of claim 11 wherein said pin emulation circuit further comprises:

a) a PROGRAM input for initiating a reconfiguration-mimicking state within the pin emulation circuit when the PROGRAM input is driven low by external circuits;

b) a DONE circuit having a first input that is responsive to the configuration clock counter circuit and a second input that is responsive to the PROGRAM input, said DONE circuit having an output that is driven low when the pin emulation circuit is in its configuration-mimicking and reconfiguration-mimicking states;

c) a high during configuration (HDC) circuit having a first input that is responsive to said DONE circuit output and a second input that is responsive to the PROGRAM input, said HDC circuit having an output that is driven high when the pin emulation circuit is in its configuration-mimicking and reconfiguration-mimicking states;

d) a low during configuration (LDC) circuit having a first input that is responsive to said DONE circuit output and a second input that is responsive to the PROGRAM input, said LDC circuit having an output that is driven low when the pin emulation circuit is in its configuration-mimicking and reconfiguration-mimicking states; and e) an INIT circuit having a first input that is responsive to the power-on-reset circuit and a second input that is responsive to the PROGRAM input, said INIT circuit having an output that is initially driven low when the pin emulation circuit is in its initialization-mimicking state, said INIT output being driven high when it detects the first command signal from the power-on-reset circuit.

13. The invention of claim 12 wherein said pin emulator circuit further comprises:

g) an HDC buffer for buffering the output of the HDC circuit;

h) an LDC buffer for buffering the output of the LDC circuit;

i) a DONE buffer for buffering the output of the DONE circuit; and j) an INIT buffer for buffering the output of the INIT circuit;

wherein each buffer has an input/output pin for receiving or transmitting signals to external circuits.

14. The invention of claim 13, wherein the INIT buffer input/output pin becomes an open collector and is pulled high after the power-on-reset counts to a preset fraction of said first predetermined count, and becomes a user I/O after the configuration clock counter counts to said second predetermined count.

15. The invention of claim 14 wherein the preset fraction is ½.

16. The invention of claim 15 further comprising means within the INIT circuit for holding the emulation circuit in its configuration state by driving the input/output pin of the INIT buffer low after the preset fraction counts.

17. The invention of claim 13 wherein the DONE circuit output becomes an open collector and its output is pulled high after the pin emulation circuit detects said second command signal and the configuration clock counter has counted to said second predetermined count.

18. The invention of claim 13, wherein the HDC buffer becomes an output and is driven high after the pin emulation circuit detects a low on said DONE input/output pin and after the power-on-reset circuit has counted to said first predetermined count.

19. The invention of claim 18 wherein said HDC buffer becomes a user I/O after the pin emulation circuit detects said DONE input/output pin going high and the configuration clock counter has counted to said second predetermined count.

20. The invention of claim 13, wherein the LDC buffer becomes an output and is driven low after the pin emulation circuit detects a low on said DONE input/output pin and after the power-on-reset circuit has counted to said first predetermined count.

21. The invention of claim 20 wherein said LDC buffer becomes a user I/O after the pin emulation circuit detects said DONE input/output pin going high after the configuration clock counter has counted to said second predetermined count.

22. The invention of claim 17 further comprising means within the DONE circuit for holding the emulation circuit in its configuration-mimicking state by driving the DONE input/output pin low before the configuration clock counter circuit counts to said second predetermined count.

23. The invention of claim 13 wherein the circuit for emulating is implemented in a gate array, said gate array including internal logic for emulating the FPGA inputs and outputs.

24. The invention of claim 23 wherein said pin emulation circuit further comprises a RESET circuit having a global reset input for connection to the for connection to external circuits in order to reset the internal logic of the gate array.

25. A method of emulating the configuration pin inputs and outputs of a field programmable gate array (FPGA), said FPGA having an initialization state and a configuration state, said FPGA producing output signals to indicate to circuits external to the FPGA the present state of the FPGA, said method comprising the steps of:

a) activating a power-on-reset circuit during initial power up;

b) counting to a first predetermined count with said power-on-reset circuit, said first predetermined count generally corresponding to a period of time said FPGA is in its initialization state;

c) activating a configuration clock counter circuit with a signal from said power-on-reset circuit;

d) counting to a second predetermined count with said configuration clock counter circuit, said second predetermined count generally corresponding to a period of time said FPGA is in its configuration state; and c) generating initialization-mimicking output signals during the period of time said power-on-reset circuit counts; and d) generating configuration-mimicking output signals during the period of time said configuration clock counter circuit counts.

\* \* \* \* \*